United States Patent
Horiuchi et al.

(10) Patent No.: US 6,469,260 B2
(45) Date of Patent: Oct. 22, 2002

(54) WIRING BOARDS, SEMICONDUCTOR DEVICES AND THEIR PRODUCTION PROCESSES

(75) Inventors: Michio Horiuchi, Nagano (JP); Takashi Kurihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/792,991

(22) Filed: Feb. 24, 2001

(65) Prior Publication Data

US 2001/0017221 A1 Aug. 30, 2001

(30) Foreign Application Priority Data

Feb. 28, 2000 (JP) ........................................ 2000-056007
Feb. 22, 2001 (JP) ........................................ 2001-047250

(51) Int. Cl.[7] ................................................. H01R 9/09
(52) U.S. Cl. ........................ 174/262; 174/261; 257/690; 361/772
(58) Field of Search ................................. 174/262, 260, 174/261; 361/761, 760, 774, 772, 773; 257/774, 775, 778, 690, 734, 692

(56) References Cited

U.S. PATENT DOCUMENTS

| 4,958,258 A | * | 9/1990 | Charruau | 361/715 |
| 5,883,355 A | * | 3/1999 | Mizumoto et al. | 361/760 |
| 6,262,426 B1 | * | 7/2001 | Zifiratos | 250/492.2 |
| 6,326,700 B1 | * | 12/2001 | Bai et al. | 257/790 |

* cited by examiner

*Primary Examiner*—Albert W. Paladini
(74) *Attorney, Agent, or Firm*—Paul & Paul

(57) ABSTRACT

A wiring board comprising a substrate having applied on the same side surface thereof one or more terminals for connecting a semiconductor element and one or more terminals for external connection, in which the terminals for connecting the semiconductor element and the terminals for external connection are electrically connected, by a wire, with each other in the interior of the wiring board, and a semiconductor device comprising the wiring board having packaged thereon semiconductor elements. Processes for the production of the wiring board and the semiconductor device are also disclosed.

30 Claims, 16 Drawing Sheets

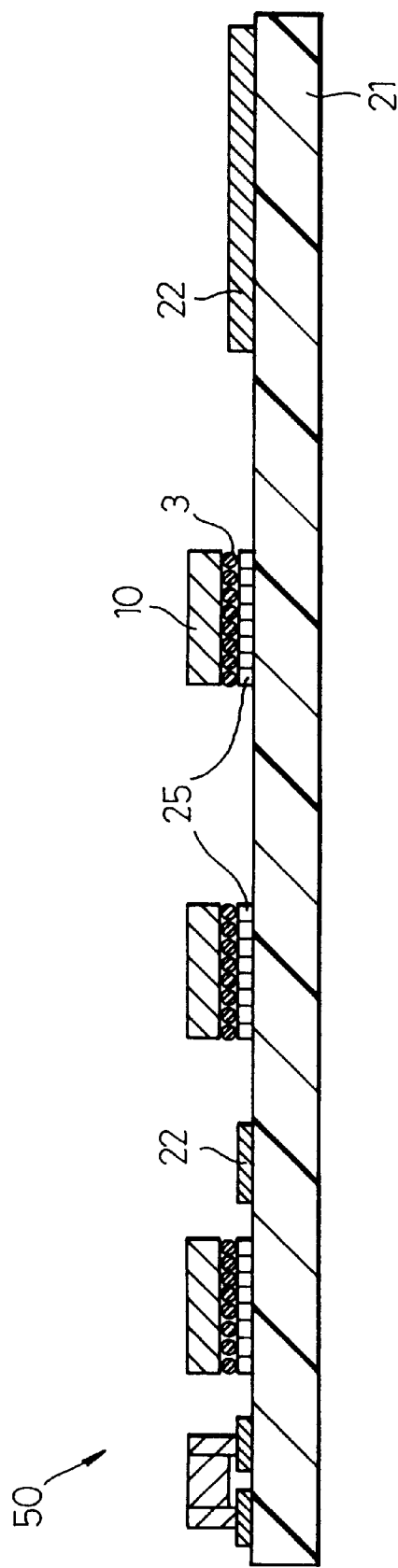

WIRING BOARDS, SEMICONDUCTOR DEVICES AND THEIR PRODUCTION PROCESSES

BACKGROUND OF THE INVENTION

1. Field of the Invention

The present invention relates to a wiring board. More particularly, the present invention relates to a wiring board ensuring a high reliability in connection and packaging and capable of preventing crosstalk between the adjacent wirings, and to a process for the production of the wiring board. The present invention also relates to a semiconductor device using the wiring board of the present invention and a process for the production thereof.

2. Description of the Related Art

Recently, there is a tendency that semiconductor elements (hereinafter, also referred to as "semiconductor chips") to be packaged in semiconductor devices have an increased number of electrode terminals, because the functions of the semiconductor devices is increasing and widened with time. Further, to satisfy such a tendency, there has been used a method of forming electrode terminals in the form of an area array on an electrode terminal-providing surface of the semiconductor chip, followed by packaging the semiconductor chip on a wiring board by flip chip bonding. Using flip chip bonding, because the bumps formed on the electrode terminals of the semiconductor chip are bonded to the corresponding terminals (bumps) for external connection of the wiring board, it becomes possible to electrically connect the electrode terminals with the terminals for external connection. Furthermore, as a more recent tendency, there has been used a so-called "built-up method", that is, a method of combining several plies of wiring board to form a laminated board. This method is particularly useful in the formation of fine wiring patterns, because the above-mentioned flip chip bonding method is not suited for the formation of such fine wiring patterns in view of a large diameter of the bumps of about 130 to 150 μm and a long distance (pitch) between the adjacent bumps of about 200 to 250 μm.

FIG. 1 is a cross-sectional view illustrating one example of the prior art semiconductor device. In the illustrated semiconductor device 50, a wiring board 1 has a semiconductor chip 10 packaged thereon, and the semiconductor chip 10 has area array-like distributed electrode terminals (bumps) 3 on a bottom surface thereof. The wiring board 1 has a built-up layer 9 in both surfaces thereof, and the one surface not bearing the semiconductor chip 10 has terminals (bumps) 2 for external connection. The semiconductor chip 10 is electrically connected through its electrode terminals 3 to a wiring pattern (not shown) of the built-up layer 9, and also through a via (not shown) of the wiring board 1 to the terminals 2 for external.connection. Further, although only two plies of the built-up layers 9 are shown in FIG. 1 for the purpose of simplification of the explanation, two or more plies of the built-up layers 9 can be laminated to form a wiring pattern which is used to electrically connect the electrode terminals 3 of the semiconductor chip 10 with the terminals 2 of the wiring board 1. Furthermore, the wiring board 1 and the semiconductor chip 10 packaged thereon are encapsulated with an electrically insulating resinous material 4.

In the semiconductor devices such as those shown in FIG. 1, the built-up layer is generally produced by using an electrically insulating resinous material such as epoxy resin or polyimide resin as a substrate. After a predetermined wiring pattern was formed on a surface of the substrate to form a built-up layer, a required number of the built-up layers (pattern-bearing substrates) are laminated, while the wiring patterns are electrically connected between the built-up layers. The resulting semiconductor devices are suitable for the formation of highly dense wiring pattern because of their built-up structure. However, they suffer from a troublesome and complicated production process and thus a highly increased production cost. In addition to these drawbacks, the semiconductor devices have a problem that reliability and production efficiency, i.e., yield, of the devices are reduced because crosstalk arises in the devices due to the short distance between the wiring patterns.

To solve the above-mentioned problems of the prior art semiconductor devices, the present inventors have developed a semiconductor device disclosed in Japanese Unexamined Patent Publication (Kokai) No. 11-163217. As shown in FIG. 2, the semiconductor device 50 comprises a wiring board 1 having packaged thereon a semiconductor chip 10. The semiconductor chip 10 has electrode terminals (not shown) provided in the pattern of area array on a lower surface thereof. The semiconductor chip 10 is packaged on one surface of the wiring board 1 in such a manner that the electrode terminals-bearing surface of the semiconductor chip 10 is outwardly positioned. Further, the same surface of the wiring board 1 has bonding pads 5 which are distributed in the form of an area array except for the chip packaging area thereof. The electrode terminal of the semiconductor chip 10 and the bonding pad 5 are electrically connected through a bonding wire 6 comprising a conductor wire and an insulating layer surrounding the wire. Furthermore, in another surface of the wiring board 1, i.e., in the surface having no semiconductor chip of the wiring board 1, the bonding pad 5 having a pattern of area array and terminal 2 for external connection are electrically connected through a conductor section 7. As is shown, the conductor section 7 is passed through the wiring board 1 in a direction of the thickness thereof. The connection between the conductor section 7 and the terminal 2 is made through a land 12 formed on an end surface of the conductor section 7. Moreover, a connection section between the electrode terminal and the bonding wire 6 and a bonding section between the bonding wire 6 and the bonding pad 5 including an adjacent area to these sections are coated with an electrically insulating layer 8 and also the chip side surface of the wiring board 1 including the semiconductor chip 10 and the bonding wires 6 is encapsulated with an electrically conductive resinous material 11.

Using the semiconductor device 50 illustrated in FIG. 2, since the electrode terminals of the semiconductor chip 10 and the bonding pads 5 of the wiring board 1 are connected through an insulating layer-coated bonding wire 6, it becomes possible to simplify the constitution of the wiring board, thereby ensuring easy production and high yield of the semiconductor devices. In addition, since the wiring necessary to complete the semiconductor device can be shortened, it becomes possible to provide semiconductor devices having excellent electric properties.

However, the above-discussed and other prior art semiconductor devices are insufficient to fully satisfy the various requirements for the semiconductor devices. It is therefore desired to further improve the prior art semiconductor devices. More particularly, for the semiconductor device of FIG. 2, since the wire bonding method is used in the connection between the terminals, the bonding operation may adversely affect the semiconductor chip and its properties. For example, heat applied to the bonding wires during bonding may cause damage to the semiconductor chip.

Further, with regard to the configuration of the wiring boards, from the view point of the producers of semiconductor devices, the wiring boards provided by their makers are desired to be supplied to the device producers as products having configurations capable of easily packaging semiconductor chips.

SUMMARY OF THE INVENTION

It is therefore one object of the present invention to provide a wiring board which exhibits a high reliability of electrical connection in the board and a high reliability of packaging of semiconductor and other chips, can prevent crosstalk between the adjacent wirings, has an excellent heat dissipation property, can easily produce impedance matching in the board, can be produced in a shortened production time and at a reduced production cost in a simplified production process, and also enables easy packaging of semiconductor and other chips onto the board by device producers.

It is another object of the present invention to provide a wiring board which has an improved ground connection structure suitable to more effectively prevent crosstalk.

Further, it is another object of the present invention to provide a simplified process for the production of an excellent wiring board, as described above, for a shorter production time and at a reduced cost, along with a high reliability and yield.

Furthermore, it is another object of the present invention to provide a semiconductor device using an excellent wiring board according to the present invention.

Moreover, it is still another object of the present invention to provide a process for the production of the semiconductor device according to the present invention.

These and other objects of the present invention will be easily understood from the following detailed description of the preferred embodiments of the present invention.

According to one aspect of the present invention, there is provided a wiring board comprising a substrate having applied on the same side surface thereof one or more terminals for connecting a semiconductor element and one or more terminals for external connection, in which said terminals for connecting the semiconductor element and said terminals for external connection are electrically connected, by wire, with each other, in the interior of said wiring board.

According to another aspect of the present invention, there is provided a process for the production of a wiring board comprising a substrate having applied on the same side surface thereof one or more terminals for connecting a semiconductor element and one or more terminals for external connection, in which said terminals for connecting the semiconductor element and said terminals for external connection are electrically connected, by a wire, with each other, which process comprises the steps of:

forming terminals for connecting the semiconductor element and said terminals for external connection in predetermined sites on the same side surface of a base body;

electrically connecting said terminals for connecting the semiconductor element and said terminals for external connection through wires;

applying a resinous material to said surface of said base body at a predetermined thickness to form a wiring board precursor comprising said base body having resin-encapsulated thereon said terminals for connecting the semiconductor element, said terminals for external connection and said wires; and separating the wiring body from the base body of said wiring board precursor.

According to still another aspect of the present invention, there is provided a process for the production of a wiring board comprising a substrate having applied on the same side surface thereof one or more terminals for connecting a semiconductor element and one or more terminals for external connection, in which said terminals for connecting the semiconductor element and said terminals for external connection are electrically connected, by wire, with each other in the interior of the wiring board, which process comprises the steps of:

providing, on predetermined sites of a base body, rods made of an electrically conductive metal and passed through said base body to form said terminals for connecting the semiconductor element and said terminals for external connection, said terminals being defined by one end surface of said rods which is exposing at one surface of said base body;

electrically connecting said terminals for connecting the semiconductor element and said terminals for external connection through wires; and applying a resinous material to said one surface of said base body at a predetermined thickness to form a wiring board having resin-encapsulated therein said terminals for connecting the semiconductor element, said terminals for external connection and said wires.

In addition, according to another aspect of the present invention, there is provided a semiconductor device comprising a wiring board and one or more semiconductor elements packaged on predetermined sites of said wiring board, in which said wiring board comprises a substrate having applied on the same side surface thereof one or more terminals for connecting a semiconductor element and one or more terminals for external connection, said terminals for connecting the semiconductor element and said terminals for external connection being electrically connected, by a wire, with each other, in the interior of said wiring board.

According to still another aspect of the present invention, there is provided a process for the production of a semiconductor device comprising a wiring board and one or more semiconductor elements packaged on predetermined sites of said wiring board, which process comprises the steps of:

forming terminals for connecting the semiconductor element and terminals for external connection in predetermined sites on the same side surface of a base body;

electrically connecting said terminals for connecting the semiconductor element and said terminals for external connection through wires;

applying a resinous material to said surface of the base body at a predetermined thickness to form a wiring board precursor comprising said base body having resin-encapsulated thereon said terminals for connecting the semiconductor element, said terminals for external connection and said wires;

separating the wiring body from the base body of said wiring board precursor; and packaging and electrically connecting said semiconductor elements onto said terminals for connecting the semiconductor element of said wiring body.

BRIEF DESCRIPTION OF THE DRAWINGS

FIG. 13 is a cross-sectional view schematically showing another preferred example of the semiconductor device of the present invention;

DESCRIPTION OF THE PREFERRED EMBODIMENTS

Figure 1:
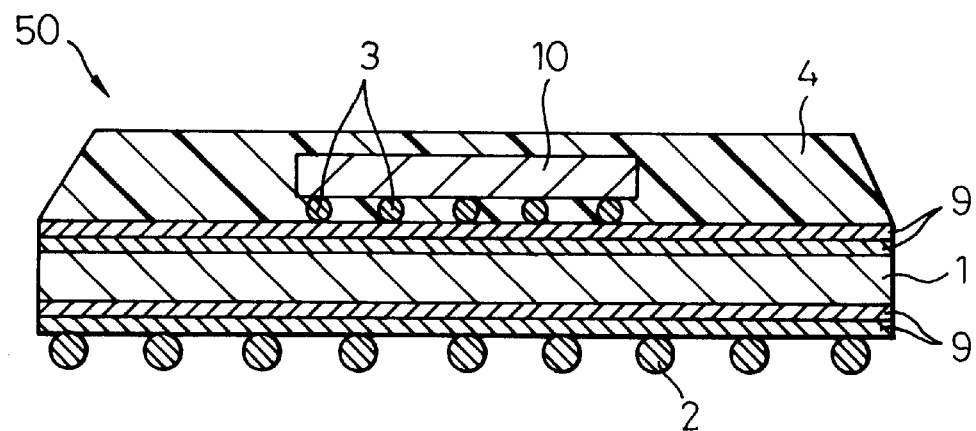
FIG. 1 is a cross-sectional view schematically showing a typical example of the prior art semiconductor device comprising a wiring board having packaged thereon a semiconductor chip.
Figure 2:
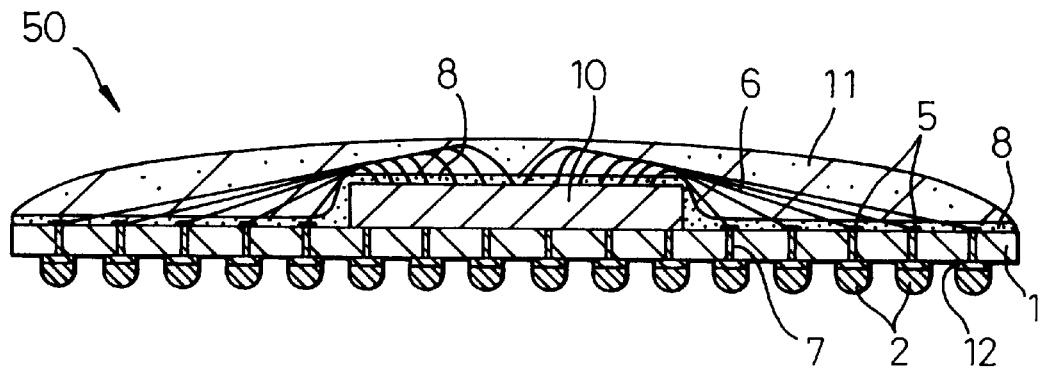
FIG. 2 is a cross-sectional view schematically showing another typical example of the prior art semiconductor device comprising a wiring board having packaged thereon a semiconductor chip.

The wiring board, semiconductor device and their production processes according to the present invention will be described hereinafter by referring to their preferred embodiments. Note, however, that the embodiments described below are typical embodiments of the present invention and thus they may be modified or improved within the spirit and scope of the present invention.

The wiring board according to the present invention is constituted so that it comprises a substrate, terminals for connecting a semiconductor element and for external connection and other elements, as in the prior art wiring board. However, the wiring board of the present invention is distinguished from the prior art wiring board with regard to the following essential features:

(1) In the wiring board of the present invention, one or more terminals for connecting a semiconductor element (hereinafter, referred also to "semiconductor terminals") and one or more terminals for external connection (hereinafter, referred also to "external terminals") are applied on the same side surface of the substrate; and (2) In an interior of the substrate, the semiconductor terminal and the external terminal are electrically connected, by wire, with each other.

That is, according to the present invention, the semiconductor terminals and the external terminals are each disposed on one surface of the substrate in such a manner that at least one end surface of the terminals is exposed from the surface of the substrate and, at the same time, an electrical connection between one terminal and another terminal is made with a wire disposed within the substrate, contrary to the prior art wiring board in which the connection of the terminals is made using a wire (generally, called as a "bonding wire") disposed out of the substrate.

The substrate used as a basic component in the wiring board of the present invention may be formed from an electrically conductive material or an electrically insulating material depending upon the specific structure of the wiring board and other factors. For example, if the bonding wire used in the connection between the terminals has a coaxial structure and its outer surface is made of an electrically insulating coating, it is preferred that the substrate is made from an electrically conductive material, preferably a conductive resinous material. Examples of suitable conductive resinous material include an epoxy resin, a polyimide resin and others, which further contain a filler such as particles or powders of an electrically conductive metal, i.e., conductor metal, dispersed therein. The conductor metal include, for example, copper, silver, gold, nickel and the like, or an alloy thereof.

On the other hand, in the above-described coaxial bonding wire, if its insulating coating as an outer layer is further covered with an electrically conductive coating, typically a conductor metal layer, it is preferred that the substrate is made from an electrically insulating material, preferably an insulating resinous material. Examples of suitable insulating resinous material include an epoxy resin, a polyimide resin and others.

In the wiring board of the present invention, as mentioned above, it is essential that the wires used for the bonding purpose are embedded within the substrate material. Preferably, according to the present invention, such a wire-embedded structure can be easily produced in an optional stage of the production process of the wiring board without adding a specific and discrete step for wire embedding to the production process.

According to one embodiment of the present invention, the substrate is preferably a flexible resin substrate made of a resinous material. Flexibility of the resin substrate can be represented by a Young's modulus determined at room temperature (about 20 to 30° C). Preferably, the resinous material used in the present invention has a Young's modulus of not more than 1 GPa at room temperature. The resinous material which can satisfy the above requirement of flexibility includes, but is not restricted to, a silicone-based elastomer, a low elasticity polyimide resin, a polyolefin resin and others. Using these resin substrates in the production of the wiring board, since the wires embedded within the substrate can be easily moved between the semiconductor terminals and the external terminals, any stress arising in the substrate due to differential thermal expansion coefficient can be effectively moderated. Further, because of its good flexibility, the substrate can be easily bent without causing disconnection, short circuiting and other defects of the embedded wires, along with easy packaging of the substrate in the semiconductor and other devices, thereby providing compact and downsized devices.

According to another embodiment of the present invention, it is preferred that the substrate is made from an electrically conductive resinous material, and wires connecting the semiconductor terminals with the external terminals, a surface of the substrate having the semiconductor and external terminals, and connecting sections of the wires with the terminals are coated with an electrically insulating material. The resulting resin-encapsulation structure of the substrate is particularly effective to improve a heat dissipation property of the semiconductor devices as a result of increase of a thermal conductivity of the substrate itself.

In addition, in the above-described resin-encapsulation structure of the substrate, to further increase the thermal conductivity of the substrate, and thereby improving the heat dissipation property of the devices, it is preferred that the electrically conductive resinous material used as a substrate material is formed from a conductor-dispersed conductive resin, and an electrically conductive material having a high heat dissipation property is used as the conductor. More preferably, the conductor-dispersed conductive resin comprises a binder resin having dispersed therein a filler such as particles or powders of an electrically conductive material, particularly, conductive metal, as in the conductive substrate mentioned above. Namely, the binder resin suitable in the formation of the resin-encapsulation structure of the substrate includes, for example, an epoxy resin and a polyimide resin, and the particulate or powdery conductor metal dispersed in the binder resin includes, for example, copper, silver, gold, nickel and an alloy thereof. Further, if desired, carbon black may be used in place of or in combination with the conductive metal. Moreover, as will be appreciated from the above description, the term "metal" used herein is intended to include a metal alloy containing the described metal as a principal component, in addition to the metal itself.

The configuration and size of the particulate or powdery conductor metal dispersed as a filler in the binder resin can be widely varied depending upon various factors such as types of the metal and the desired level of conductivity. Preferably, the conductor metal is used in the form of spherical body or similar bodies, and their diameter is preferably in the range of about 10 to 200 $\mu$m.

In the wiring board of the present invention, to ensure an improved ground connection, it is preferred that the substrate is made of the electrically conductive resinous material and is electrically connected to a ground potential.

Further, with regard to at least a part of the bonding wire, it is preferred that the wire is constituted from a wire of electrically conducting material (conductor wire), and the wire has coated on the surface thereof a layer of an electrically insulating material having a specific inductive capacity of at least 20. In such a coated wire, preferably, at least a part of the wire has an uncoated section. The uncoated section, i.e., the exposed conductor wire can be advantageously utilized for the ground connection purpose, because it has no insulating overcoat layer.

According to still another embodiment of the present invention, it is preferred that the substrate is made from an electrically insulating resinous material, and wires connecting between the semiconductor terminals and the external terminals, a surface of the substrate having the terminals and connecting sections of the wires with the terminals each has a duplicated coating, that is, a coating of an electrically insulating material (insulating coating) and a layer of an electrically conductive metal (conductor metal layer) applied in sequence on a surface of each wire, surface and section. In the resulting resin-encapsulated structure of the wiring board, if the conductor metal layer is electrically connected with a ground potential, it becomes possible to more effectively prevent crosstalk as a result of enhancement of ground connection. Moreover, in the coaxial wires of the wiring board, the conductor metal layer as an outermost layer can be advantageously formed upon plating of conductor metal, as will be described in detail below.

In the wiring board of the present invention, it is essentially required that the terminals for connecting a semiconductor element and the terminals for external connection are totally fabricated on only one surface, i.e., same side surface, of the substrate. Such a concentrated application of the terminals on the same side surface of the substrate is particularly effective to simplify the constitution of the wiring board and thus the constitution of the semiconductor and other devices having the wiring board, along with simplification of the production process itself.

The distribution pattern and size of the semiconductor terminals and the external terminals fabricated on the surface of the substrate are not restricted to the specific one. They may be widely changed depending upon the desired construction and function of the wiring board and other factors in a manner similar to those applied to the conventional wiring boards. For example, the semiconductor terminals can be fabricated as an area array-like pattern in conformity with the configuration and the constitution of the semiconductor element to be packaged thereon. Similarly, the external terminals can be fabricated as an area array-like pattern in conformity with the pattern of the semiconductor terminals.

As one preferred example thereof, the wiring board of the present invention has, fabricated in two or more sites or areas of a single surface of the substrate, terminals for connecting a semiconductor element. The semiconductor terminals are electrically connected through a bonding wire. The bonding wire is embedded in the interior of the substrate in accordance with the present invention and in such a manner that the wire is extending from one semiconductor terminal from another semiconductor terminal. Of course, the above electrical connection may be any one of the connection between the semiconductor terminals, the connection between the semiconductor terminal and the external terminal and the connection between the external terminals. Such a distribution of multiple semiconductor terminals is particularly suitable in the production of multi-chip modules or similar devices, because two or more semiconductor elements can be packaged on one semiconductor device.

The terminals for connecting a semiconductor element and the terminals for external connection each may have the structure similar to that of the terminals used in the conventional wiring boards. That is, these terminals may be fabricated in the form of an exposed pad, for example, on a surface of the substrate. Further, the terminals may be in the form of a single layer structure or, if necessary, they may be in the form of a multi-layered structure such as two-layered structure. Furthermore, the terminals may be formed from any conductive material, insofar as they ensure the expected electric connection. Suitable conductive materials include a conductor material such as metal and the like. Suitable conductor metals include, but are not restricted to, gold, silver, copper, palladium, cobalt, nickel or an alloy thereof. Moreover, if desired, the terminals may have a bump, land and other connecting means on a top surface thereof to increase a reliability of the connection, as is generally carried out in the field of the wiring board.

The semiconductor and external terminals mentioned above may be produced by using conventional terminal formation technologies. Suitable terminal formation technologies include, for example, a method of selectively plating a conductor metal on the predetermined area of the substrate, and a method of plating a conductor metal over a full surface of the substrate in the presence of a resist mask, followed by removing the resist mask along with the deposited conductor metal to expose the terminals from the substrate. The size of the resulting terminals may be widely varied depending upon the particulars of the terminals and other factors. Generally, when the terminals have a configuration of the cylindrical protrusion, they may have a diameter of about 100 to 200 $\mu$m and a height, exclusive of a first pad made of a solder bump, of about 5 to 30 $\mu$m.

In the wiring board of the present invention, wires used as a connecting means between the semiconductor terminals and the external terminals may be any bonding wires which are conventionally used in the production of the wiring boards. However, in the practice of the present invention, since the wires are embedded in the resinous material as the substrate, it is at least necessary that the wires have a high resistance to the resinous material.

To particularly avoid the generation of crosstalk, it is preferred that the bonding wires have a coaxial or concentric structure. That is, it is preferred that the wires are constituted from a conductor wire made of an electrically conductive material (conductor) and the conductor wire has on a surface thereof a coating of an electrically insulating material. The conductive material constituting a core portion of the wire is preferably a conductor such as metal. Suitable conductor metals include, for example, gold, silver, copper, nickel, aluminum or an alloy thereof. Further, the insulating coating for the conductor wire is preferably formed by a coating of an insulating resin such as an epoxy resin or a polyimide resin. Moreover, if the conductor wire is an aluminum wire, the insulating coating is preferably formed upon oxidation of the aluminum wire, since the resulting aluminum oxide coating can exhibit a good insulating property. The resin coating can be preferably formed by using any conventional coating technology such as electrostatic coating, spray coating and dip coating.

In addition to the above-mentioned coaxial structure consisting of a conductor wire and a conductive coating, the bonding wires may have any other structure. For example, the bonding wires may have a coaxial structure of the conductor wire having applied, in sequence, on the surface thereof, an insulating coating and a conductor metal layer. The conductor metal layer may be formed from a conductor metal such as gold, silver, copper, nickel, aluminum or an alloy thereof. Especially, copper can be advantageously used as the conductor metal. A copper layer can be preferably deposited by electroless copper plating or electrolytic copper plating over an outer surface of the underlying insulating coating. The conductor metal layer is preferably electrically connected to a ground potential.

The bonding wires may have a wide variety of sizes depending on the particulars of the wires such as their embedding positions in the substrate and the timing of forming an insulating layer. For example, a diameter of the conductor wire as a core is generally in the range of about 20 to 40 $\mu$m. Further, the thickness of the insulating coating covering the core, if a commercially available conductor wire having an insulating coating is used as a bonding wire without making any modification or the like, is generally in the range of about 2 to 8 $\mu$m. Alternatively, if the bonding wire is produced by conducting a wire bonding step using an uncoated conductor wire, followed by applying an insulating coating to an outer surface of the conductor wire, a thickness of the insulating coating is generally in the range of about 10 to 50 $\mu$m. A thickness of the insulating coating will be varied depending on the specific material of the insulating coating and the required level of the impedance matching, for example. Note in the wiring board of the present invention that, as briefly described above, a capacitance can be given to the resulting wiring board, if properties such as specific dielectric constant of the material constituting an insulating coating and a thickness of the insulating coating are controlled in conformity to the specific conductive resin surrounding the wire. As in the insulating coating, a thickness of the conductor metal layer covering the insulating coating may be widely varied depending on the desired effects and the like, if desired. A thickness of the conductor metal layer is generally in the range of about 5 to 30 $\mu$m.

According to still another embodiment of the present invention, it is preferred that the substrate has a cavity, i.e., recess portion, for receiving one or more semiconductor elements. In the cavity of the substrate, its bottom surface is intended to define a surface to which the terminals for connecting the semiconductor element are applied. Since the cavity having a depth sufficient to receive a semiconductor element therein was formed in a terminal-providing area of the substrate, a semiconductor element can be advantageously built into the cavity of the substrate. Particularly, when the semiconductor element packaged has a relatively small thickness, an amount of the semiconductor element protruding from a surface of the substrate can be cancelled or diminished to a negligible level, thereby providing compact and downsized semiconductor devices.

The wiring boards described above can be advantageously produced in different production processes in accordance with the present invention. Typical embodiments of the preferred production processes will be described hereinafter. Note, however, in the following descriptions of the production processes, that the detailed explanations concerning the constitutional components of the wiring board will be omitted because they can be found in the above paragraphs.

In the production of the wiring boards according to the present invention, it is necessary to provide a base body. The base body, as mentioned above, is used as a temporary support for carrying the unfinished wiring board during production of the wiring board. Generally, and preferably, the base body is a copper plate, because the copper plate can be easily fabricated to the desired configuration by using the conventional processes such as etching and stamping. Of course, any other plate-like materials may be used in place of the copper plate, if such materials do not adversely affect the production process and the resulting functions and the effects are comparable to those of the copper plate. Suitable base body materials include, for example, metals other than copper, ceramics and plastics.

Next, terminals for connecting a semiconductor element (semiconductor chip) and terminals for external connection are formed on the predetermined sites on the same side surface of the base body. The semiconductor terminals and the external terminals both can be produced by using different conventional processes. Generally, these terminals can be advantageously produced with a photolithographic process. That is, after a resist material was coated over a full surface of the base body, the resist coating is selectively removed from the predetermined areas to which the terminals are applied at a later stage. Thereafter, a terminal-providing material such as gold, palladium, cobalt, nickel or the like is deposited over the resist-coated base body with, for example, electrolytic plating in such a manner that the resist coating and the exposed areas of the base body are fully covered with the plating. The resist coating is used as a masking means during this plating process. Upon removal of the used resist coating, the selectively deposited plating is obtained in the unmasked areas of the base body. The plating can act as the terminals.

The electrolytic plating will be further described. The plating can be carried out by using different processes which are well-known and conventionally used in the field of plating. Generally, the semiconductor terminals and the external terminals each is formed as a single-layered pad by the plating, however, if desired, the terminals may be formed as a composite pad having a multi-layered structure. Namely, the composite pad can be formed, for example, by depositing a first pad of a low melting point metal by plating, followed by depositing a second pad of a higher melting point metal having a melting point higher than that of the low melting point metal. The low melting point metal is preferably used in the form of an alloy of two or more metals. Suitable low melting point alloy includes, for example, tin-lead alloy (SnPb), tin-silver alloy (SnAg), tin-copper-silver alloy (SnCuAg) and the like. In addition, if the terminals are formed as a composite pad as mentioned above, it is preferred that the plating is carried out under the conditions that the first pad is deposited in a wider area than the deposition area of the second pad.

After formation of the semiconductor and external terminals, the semiconductor terminals and the external terminals are electrically connected through wires. As described above, the electrical connection between the terminals can be advantageously carried out by using a bonding wire comprising a conductor metal wire surrounded with an insulating coating or a bonding wire comprising a conductor metal wire having a duplicated coating of the insulating material and the conductor metal. More particularly, a series of the processing steps including the electrical connection step can be advantageously carried out as follows:

(1) After the semiconductor terminal and the external terminal were connected with a conductor wire, a terminal-bearing surface of the base body, the resulting connection section between the terminals and the conductor wire are coated with a suitable insulating material to form an insulating coating, and then they are fully covered with an electrically conductive resinous material to form a resin-encapsulation structure. Especially, the resulting resin-encapsulation structure is referred herein to as a "precursor of the wiring board" or "wiring board precursor" to distinguish it from the wiring board as a final product.

(2) After the semiconductor terminal and the external terminal were connected with a conductor wire, a terminal-bearing surface of the base body, the resulting connection section between the terminals and the conductor wire are coated with a suitable insulating material to form an insulating coating, and then the insulating coating is further coated with a conductor metal to form a conductor metal layer. A terminal side surface of the base body having the duplicated coating is fully covered with an electrically insulating resinous material to form a resin-encapsulation structure, i.e., precursor of the wiring board.

In the resin encapsulation step, the terminal side surface of the base body is covered with an electrically conductive or insulating resinous material. A coverage of the resinous material may be widely varied, however, to obtain a precursor of the wiring board having no exposed bonding wire, it is necessary that the resinous material is applied to the base body at a thickness sufficient to fully embed the wires and the terminals in the resulting resinous layer. The encapsulation of the resinous material is preferably carried out by using an automatic molding process or a potting process.

After the resin encapsulation step was completed, the precursor of the wiring board is divided into two sections, i.e., the wiring board of the present invention and the used base body. The removal of the used base body may be carried out with any conventional processes, however, preferably, it can be carried out through etching off of the base body. The etching conditions can be widely varied depending on the specific properties of the wiring board and the base body as well as other factors.

According to another embodiment of the present invention, the wiring board of the present invention can be produced in accordance with the following process.

The semiconductor terminals and the external terminals are formed in the predetermined sites on one surface of the base body. Then, the terminals are connected by a bonding wire with each other, and the base body including the bonded terminals is covered with a resinous material at a predetermined thickness to produce a precursor of the wiring board comprising a resin-encapsulated terminals and bonding wires on the base body. These steps can be carried out by repeating the corresponding steps of the above-described production process.

After preparation of the precursor of the wiring board, openings are formed on predetermined sites, i.e., the surface areas contacting the terminals, of the base body of the precursor. The openings are foamed as through-holes of the base body and to have a diameter smaller than the area of the terminals. Preferably, the openings can be produced by an etching process. Namely, to produce the openings, a surface of the base body is masked with a suitable masking material such as resist except for the openings-providing areas, and under such masking conditions, the exposed base body is selectively dissolved and removed with a suitable etchant. Of course, the etching process may be a dry process or a wet process depending upon the details of the production process.

Alternatively, the above production process may be modified to be the following steps in series: formation of the openings in the predetermined sites of the base body, formation of the connection terminals, bonding of the wires, and encapsulation of the terminals and the like with a resin.

After the openings were bored as through-holes in the base body, the openings are filled with a low melting point metal. The base body is heated to a temperature slightly higher than the melting point of the filled low melting point metal to cause shrinkage of the metal. The base body and a masking means (generally, resist) remaining on a surface of the base body are dissolved and removed with a suitable etching solution. Thereafter, the undissolved and thus remaining low melting point metal on the semiconductor and external terminals is again melted (reflowed) at an elevated temperature to obtain a spherical body of the low melting point metal. Thus, a solder bump capable of being used as a semiconductor terminal or an external terminal is obtained.

According to still another embodiment of the present invention, the wiring board of the present invention can be produced in accordance with the following process.

After provision of a base body, rods of a conductor metal, i.e., cylindrical metals, are applied to the predetermined sites of the base body in such a manner that the rods are passed through the base body. One end surface of the rods is exposed from a surface of the base body to thereby form the semiconductor terminals and the external terminals.

The semiconductor terminals and the external terminals are electrically connected with wires. The bonding between the terminals can be carried out in accordance with the wire bonding process described above.

After completion of the electrical connection of the terminals, a terminal-bearing surface of the base body is covered with a resinous material at a predetermined thickness to form a wiring board having resin-encapsulated therein the semiconductor terminals, the external terminals and the wires.

Figure 17:
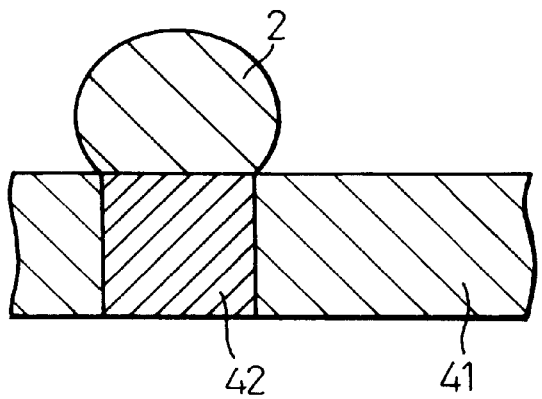
FIG. 17 is an enlarged cross-sectional view schematically showing another modification of the connection section of the semiconductor device of FIG. 15.

In the above production process, the formation of metal rods in the base body can be carried out with different methods. For example, the metal rods can be produced in the base body by providing a suitable base body, followed by opening holes for receiving the rods in the base body by etching, and inserting the rods in the holes. Alternatively, the metal rods may be produced by filling or plating the opened holes with a metal suitable as a rod material. More particularly, the details of the metal rod formation can be found in, for example, Japanese Unexamined Patent Publication (Kokai) Nos. 8-78581, 9-331133, 9-331134 and 10-41435. The wiring board explained hereinafter with reference to FIG. 17 is thus produced.

The steps following the metal rod formation, i.e., the wire bonding step and the resin encapsulation step can be carried out by repeating the corresponding steps in the production process described above.

According to the present invention, in addition to the wiring board and its production processes described above, the semiconductor device using the wiring board of the present invention and its production process are also provided.

Accordingly, the semiconductor device of the present invention comprises a wiring board and one or more semiconductor elements packaged on predetermined sites of the wiring board, and is characterized in that the wiring board is constituted in accordance with the present invention so that it comprises a substrate having applied on the same side surface thereof one or more terminals for connecting a semiconductor element and one or more terminals for external connection, and the terminals for connecting the semiconductor element and the terminals for external connection are electrically connected, by a wire, with each other in the interior of the wiring board.

In the semiconductor device of the present invention, the semiconductor elements packaged on the substrate of the device are not restricted to the specific elements. They include, for example, a wide variety of semiconductor chips such as IC chips, LSI chips, C/C and others. Of course, if it is appropriate, any other components such as capacitors and the like may be packaged in place of or in combination with the semiconductor chips. Packaging of the semiconductor chips and others may be carried out by using conventional methods such as flip chip connection, chip mounting and the like. After packaging of the chips, the substrate is encapsulated with a suitable conductive or insulating resinous material to obtain a resin-encapsulated structure.

EXAMPLES

The present invention will be further described with regard to the examples thereof by referring to the accompanying drawings. Note, however, that the present invention should not be restricted to these examples. It should be also noted in the drawings that terminals 25 for connecting a semiconductor element are illustrated in such a manner that the adjacent terminals 25 are contacted with each other, however, they are discretely provided on the wiring board, unless otherwise specified.

Figure 3:
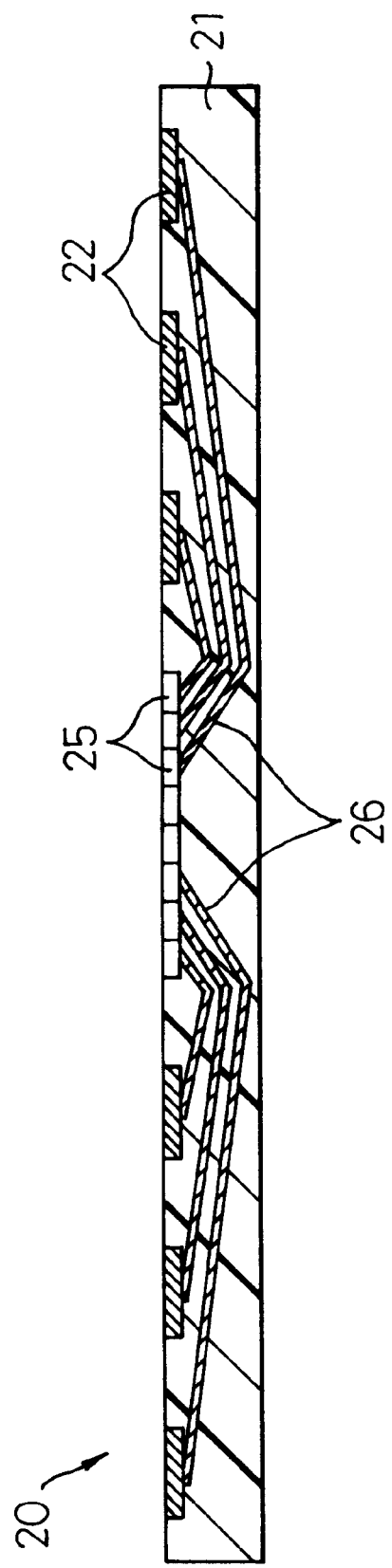
FIG. 3 is a cross-sectional view schematically showing one preferred example of the wiring board according to the present invention.

FIG. 3 is a cross-sectional view showing one preferred example of the wiring board according to the present invention. As is illustrated, a wiring board 20 is constituted from a substrate 21 as well as connection terminals 25 for packaging a semiconductor element (semiconductor chip) and connection terminals 22 for external connection, both formed on one same side suface of the substrate 21. Further, although not shown, the wiring board 20 may optionally contain additional wires and other components which are conventionally used in the production of the wiring boards, if necessary. The semiconductor terminals 25 and the external terminals 22 are electrically connected through bonding wires 26.

Figure 4:
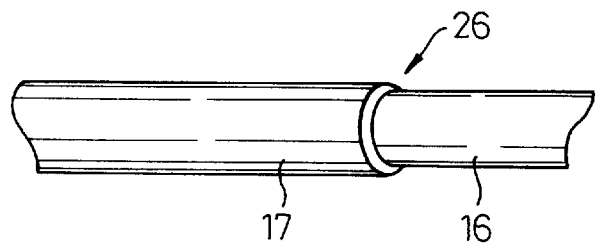
FIG. 4 is a perspective view schematically showing a constitution of the wire used for the electrical connection purpose in the wiring board of FIG. 3.

In the wiring board 20, the substrate 21 constituting a main part of the board 20 is formed from a electrically conductive resinous material. Further, the bonding wires 26 embedded in the substrate 21, to separate them from the substrate 21, have the specific structure shown in FIG. 4. Namely, the bonding wires 26 have a coaxial structure consisting of a core body and a surrounding outerlayer. The core body of the bonding wires 26 is constituted from a conductor wire 16, and the conductor wire 16 is made from a conductor metal (gold is used herein). The outerlayer is constituted from an insulating coating or layer 17 of the insulating resinous material. The wiring board 20 of FIG. 3 can be produced, for example, in accordance with the production process which will be described below, in sequence, referring to FIGS. 5A to 5D.

Figure 5A:
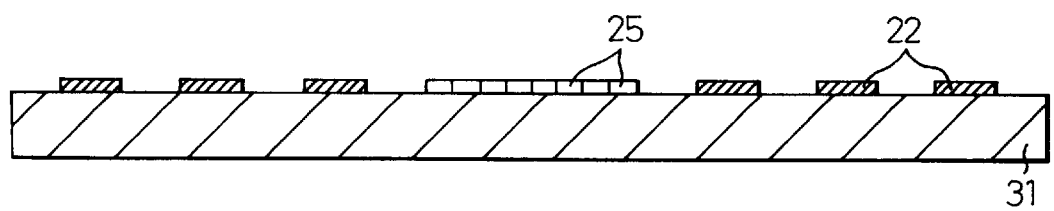
FIGS. 5A to 5D are cross-sectional views showing, in sequence, one preferred production process of the wiring board of FIG. 3.

First, as is shown in FIG. 5A, semiconductor terminals 25 and external terminals 22 are formed in the predetermined sites on one surface of the base body 31 consisting of copper plate. In the illustrated instance, since the terminals 25 and 22 are required to have a good resistance to an etchant used in the later copper plate removal step, they were made from gold by its plating. In addition, although not shown, since the terminals 25 and 22 have a design to be exposed on a surface of the wiring board 20, they may be produced by making an additional metal plating prior to the gold plating to improve a bonding strength between the terminals and the semiconductor chip. Plating metal suitable for the additional metal plating includes, for example, cobalt, palladium and the like.

Figure 5B:
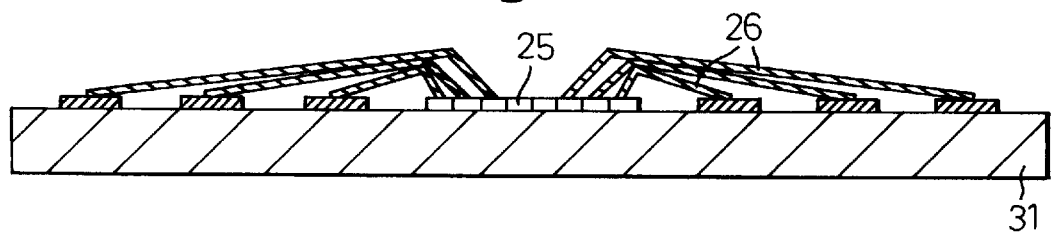

Next, as is shown in FIG. 5B, the semiconductor terminals 25 and the external terminals 22 on the base body 31 are electrically connected with the bonding wires 26. The bonding wires 26 have a coaxial structure already explained referring to FIG. 4. Bonding of the wires 26 can be carried out, for example, by bonding a core body of gold (gold wire) to each of the terminals 25 and 22, and then spray coating each gold wire with a powder of the resinous material (an epoxy resin is used herein) after grounding the base body 31 to obtain the spray coating conditions.

Figure 5C:
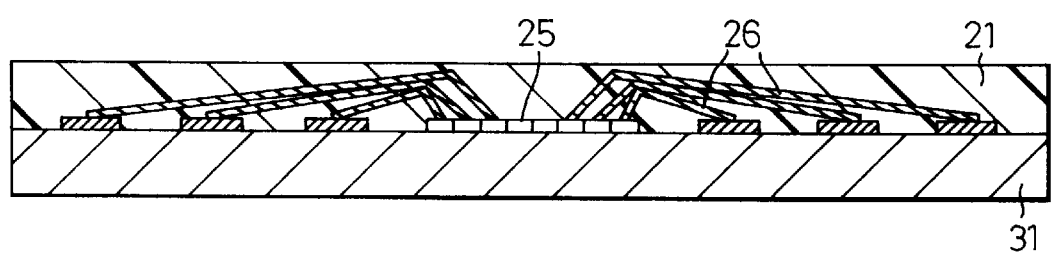

After completion of the wire bonding of the terminals, as is shown in FIG. 5C, the terminal side surface of the base body 31 is fully encapsulated with a resinous material 21 which acts as a substrate-providing material. In this instance, the encapsulation resin is a polyimide resin, and it was applied to the full surface of the base body 31 by potting. The surface of the base body 31 is covered with the polyimide resin 21 at the thickness sufficient to embed the terminals 25 and 22 and the wires 26 with the resin 21. The thus obtained original of the wiring body is particularly referred herein to as "precursor of the wiring board".

Figure 5D:
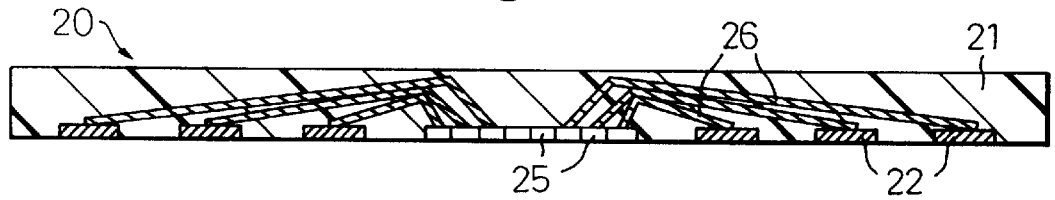

Subsequently, the precursor of the wiring board is separated at an interface between the polyimide resin 21 and the underlying base body 31 to obtain a wiring board. To separate a layer 21 of the polyimde resin from the base body 31, the precursor is dipped in a solution of the etchant for copper to selectively dissolve off the base body 31. Since the polyimide resin layer 21 including the terminals 25 and 22 and the wires 26 is not dissolved in the etchant solution, the wiring board shown in FIG. 5D is obtained. As will be understood, the resulting wiring board is the same as the wiring board 20 explained above with reference to FIG. 3.

Figure 6:
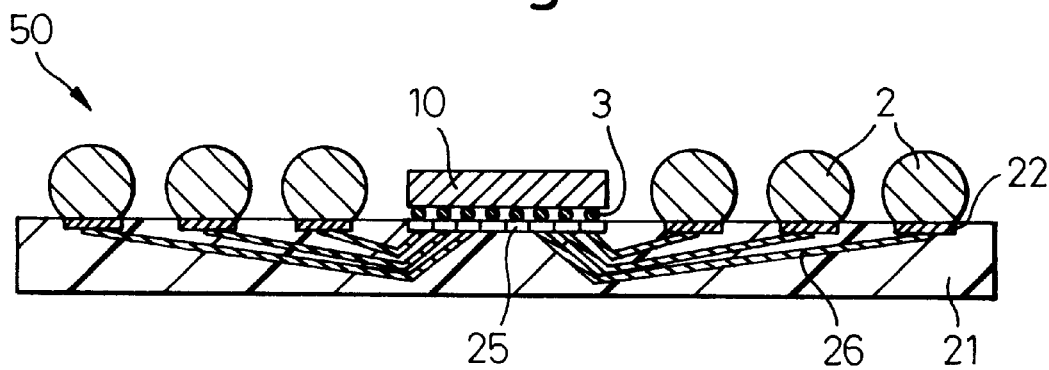
FIG. 6 is a cross-sectional view schematically showing one preferred example of the semiconductor device according to the present invention.

FIG. 6 is a cross-sectional view illustrating one preferred example of the semiconductor device according to the present invention. The illustrated semiconductor device 50 shows one example of the application of a semiconductor chip 10 onto the wiring board 20 shown in FIG. 3. The semiconductor chip 10 is packaged on the semiconductor terminals 25 of the wiring board 20 and electrically connected through the bumps 3 to the wiring board 20. Further, a large-sized bump 2 is formed on each of the external terminals 22 for the connection purpose. Each bump 2 is made of a solder bump (SnAg). The substrate 21 is made of a polyimide resin, and to increase an electrical conductivity and a thermal conductivity of the substrate 21, the polyimide resin contains metal powders (fillers) dispersed therein. Further, the conductive substrate 21 may be electrically connected to a ground potential, if desired. Furthermore, a peripheral portion surrounding the bumps 3 of the semiconductor chip 10 may be sealed with an underfilling material.

Figure 7A:
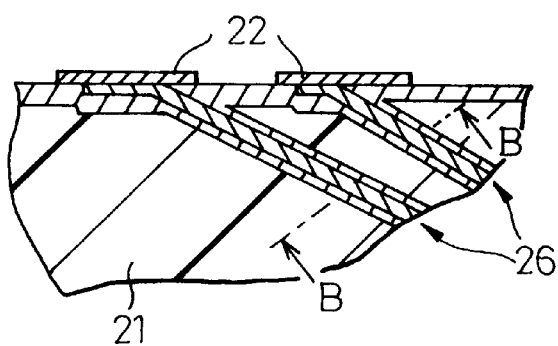
FIGS. 7A to 7C are enlarged cross-sectional views schematically showing a wire bonding section of the semiconductor device of FIG. 6.
Figure 7C:
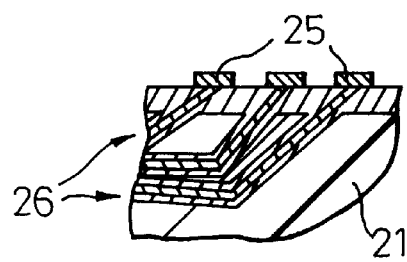
Figure 7B:
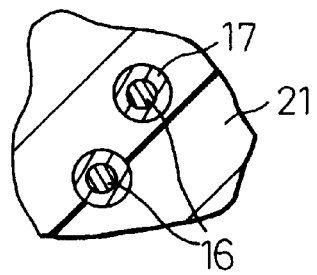

In the semiconductor device 50 of FIG. 6, the electrical connection between the semiconductor terminals 25 and the external terminals 22 through the bonding wires 26 may be modified as is shown in FIGS. 7A and 7B. Namely, in the illustrated semiconductor device 50, the substrate 21 is made of an electrically conductive resinous material, and the bonding wires 26, as shown in FIG. 7B which is a cross-sectional view taken along line B—B of FIG. 7A, are constituted from a conductor wire 16 of a conductor metal and an insulating coating 17 covering the conductor wire 16. A surface of the substrate 21 is coated with an electrically insulating material which is the same as the insulating coating 17 to make it electrically insulating. Moreover, although not illustrated, the bonding wires 26 may be partly removed its insulating coating 17, because the thus resulting exposed portion of the conductor wire 16 can be utilized as a ground without further fabrication.

Figure 8A:
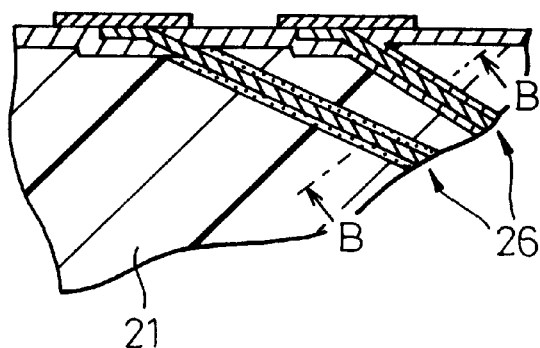
FIGS. 8A and 8B are enlarged cross-sectional views schematically showing one modification of the wire bonding section illustrated in FIG. 7 and FIGS. 7A to 7C.
Figure 8B:
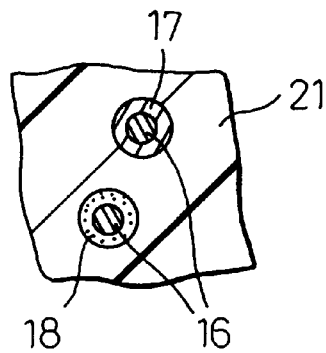

The bonding wire 26 of FIGS. 7A to 7C may be modified as is illustrated in FIGS. 8A and 8B. In the illustrated bonding wire 26, the conductor wire 16 is made of the same conductor metal as that of the bonding wire 26 of FIGS. 7A to 7C, however, the conductor wire 16 has different insulating coatings. Namely, as is shown in FIG. 8B which is a cross-sectional view of line B—B of FIG. 8A, one insulating coating 17 and another insulating layer 18 are made of different insulating materials so that they exhibit different dielectric constants. The inventors have found that a capacitance can be obtained, if the insulating coatings are made of a dielectric material having a specific dielectric constant of 20 or more and at the same time, the substrate is made of a dielectric resinous material and has a ground potential.

Figure 9:
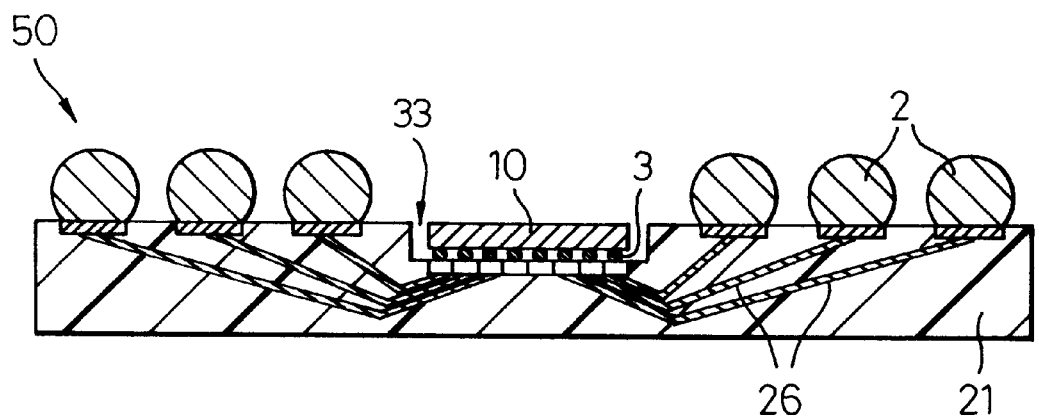
FIG. 9 is a cross-sectional view schematically showing another preferred example of the semiconductor device according to the present invention.

FIG. 9 illustrates one modification of the semiconductor device of FIG. 6. In the illustrated semiconductor device 50, a semiconductor chip 10 is contained and packaged in a cavity 33 opened in one surface of the substrate 21. The cavity 33 has a bottom surface which is defined by a surface bearing the semiconductor terminals 25 of the substrate 21. The illustrated structure having a cavity is particularly convenient when the semiconductor chip to be packaged has a relatively small thickness. In addition, this structure is useful in the downsizing and compacting of the semiconductor device 50. Note in the illustrated semiconductor device 50 that the cavity 33 may be encapsulated with a suitable resin with potting or other methods to have a resin-encapsulation structure of the semiconductor chip 10, if desired.

The semiconductor device 50 of FIG. 9 can be generally produced in accordance with the production process which is similar to that explained above with reference to FIGS. 5A to 5D. Namely, it can be advantageously produced in the production process of FIGS. 10A to 10D.

Figure 10A:
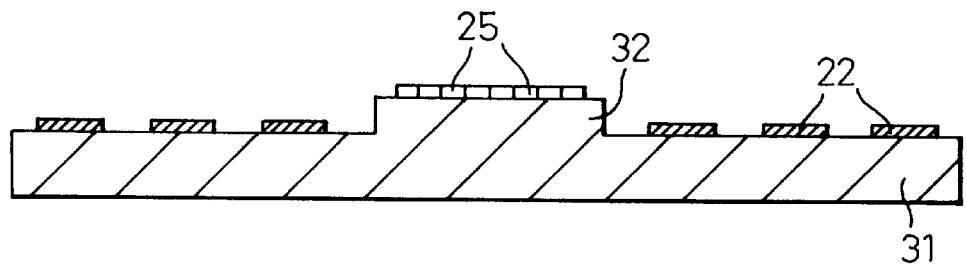
FIGS. 10A to 10D are cross-sectional views showing, in sequence, one preferred production process of the wiring board used in the semiconductor device of FIG. 9.

First, as is shown in FIG. 10A, semiconductor terminals 25 and external terminals 22 are formed in the predetermined sites on one surface of the base body 31 consisting of copper plate. In the illustrated instance, the semiconductor terminals 25 are formed on a protruding section 32 of the base body 31 after the protruding section 32 was previously formed on the predetermined area of the base body 31 in conformity with the configuration and size of the cavity 33 to be formed in the wiring board 20.

Figure 10B:
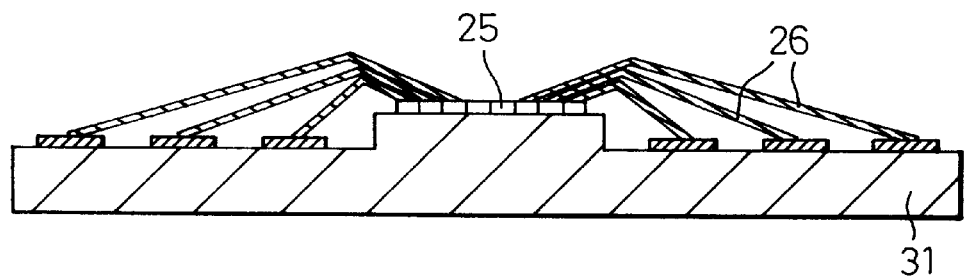
Figure 10C:
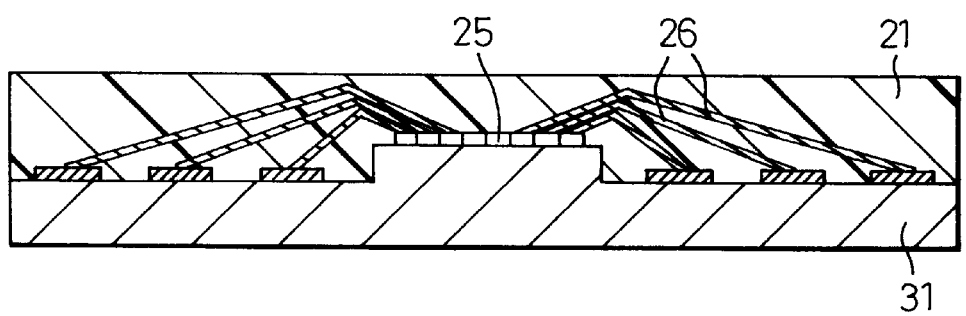

Next, as is shown in FIG. 10B, the semiconductor terminals 25 and the external terminals 22 on the base body 31 are electrically connected with the bonding wires 26. Then, after completion of the wire bonding of the terminals, as is shown in FIG. 10C, the terminal side surface of the base body 31 is fully encapsulated with a polyimide resin 21.

Figure 10D:
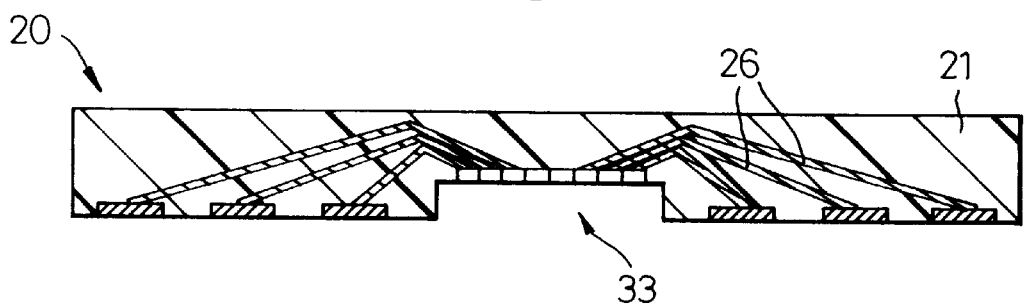

Subsequently, the resulting precursor of the wiring board is separated at an interface between the polyimide resin 21 and the underlying base body 31 to obtain a wiring board. The precursor is dipped in a solution of the etchant to selectively dissolve off the base body 31. As a result, as shown in FIG. 10D, a wiring board 20 which is the same as the wiring board 20 used in the semiconductor device 50 of FIG. 9 is obtained.

In the practice of the present invention, the wiring board can be also advantageously produced by other different production processes. For example, to omit the step for forming a solder bump which is conventional in the prior art production of the wiring boards, thereby simplifying the production process and increasing an efficiency of the production, the wiring board can be advantageously produced in accordance with the production process which will be described below with reference to FIGS. 11A to 11D.

Figure 11A:
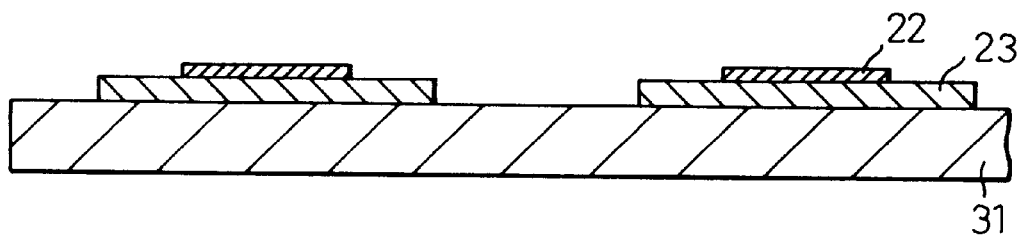
FIG. 11A to 11D are cross-sectional views showing, in sequence, another preferred production process of the wiring board according to the present invention.

First, as is shown in FIG. 11A, semiconductor terminals (not shown) and external terminals 22 are formed in the predetermined sites on one surface of the base body 31 consisting of copper plate. Note in the illustrated instance that the formation of the semiconductor terminals is omitted to simplify the explanation of the production process. Further, it is important in this production process that the external terminals 22 are not directly deposited on the base body 31, but they are deposited through a first pads 23 to the base body 31. That is, the first pads 23 are deposited as a low melting point metal upon plating, and then the external terminals 22, also referred herein as second pads, are deposited as another metal which has a higher melting point than that of the low melting point metal of the first pads 23. More particularly, the first pads 23 are made of an alloy of tin-lead (SnPb), and the second pads 22 are made of an alloy of nickel-gold (NiAu) having a higher melting point than the SnPb alloy. Further, in this terminal formation step, it is preferred that plating is carried out in such a manner that the first pads 23 have a large plating surface than that of the overlying second pads 22. This is because a height of the resulting bump can be increased after reflowing, when a volume of the first pads (low melting metal) 23 as a bump-providing material is increased.

Figure 11B:
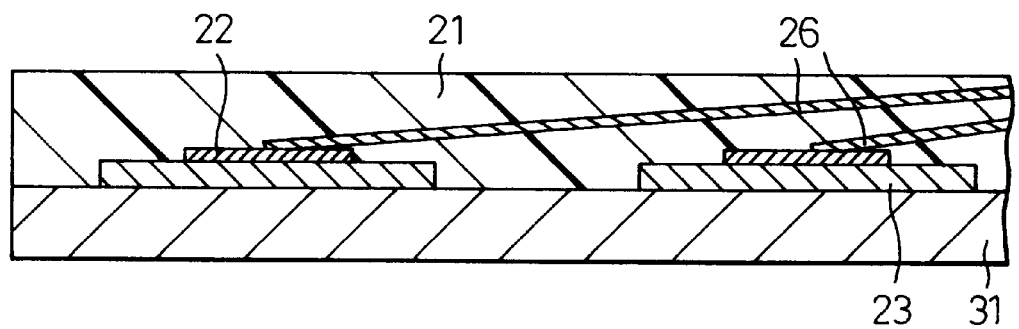
Figure 11C:
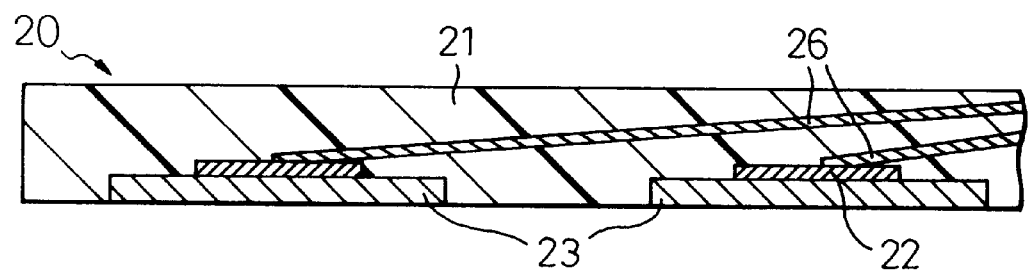

Next, as is shown in FIG. 11B, the semiconductor terminals (not shown) and the external terminals 22 on the base body 31 are electrically connected with the bonding wires 26. Then, the terminal side surface of the base body 31 is fully encapsulated with a polyimide resin 21. Thereafter, the resulting precursor of the wiring board is separated at an interface between the polyimide resin 21 and the underlying base body 31 to obtain a wiring board. The precursor is dipped in a solution of the etchant to selectively dissolve off the base body 31. The first pads 23 are neither dissolved nor etched with the etchant solution. As a result, as shown in FIG. 11C, a wiring board 20 is obtained.

Figure 11D:
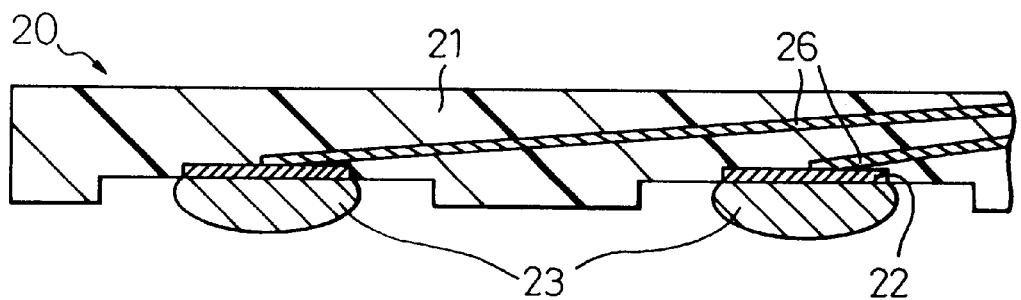

Finally, the wiring board 20 is heated to a temperature higher than the melting point of the alloy of the first pads 23. Spherical bumps shown in FIG. 11D are produced as a result of melting of the pads 23. Apparently, the spherical bumps can act as true external connection terminals. Note that the size of the resulting spherical bumps can be freely controlled by changing the wettability of the first pads 23 and the heating temperature of the wiring board 20, for example.

FIGS. 12A to 12D illustrate, in sequence, another preferred example of the production process of the wiring board according to the present invention. The illustrated production process comprises the steps of forming openings in a metallic base body in such a manner that the openings are passed in the thickness direction through the base body, while a diameter of the openings is controlled to be smaller than the diameter of the external connection terminals (pads), filling each opening with a low melting point alloy by its electrolytic plating or by filling each opening with a conductive paste, selectively removing the base body, and reflowing the low melting point alloy to obtain its spherical product. Note in the illustrated instance that only a part of the base body 31 is shown to simplify the illustration.

Figure 12A:
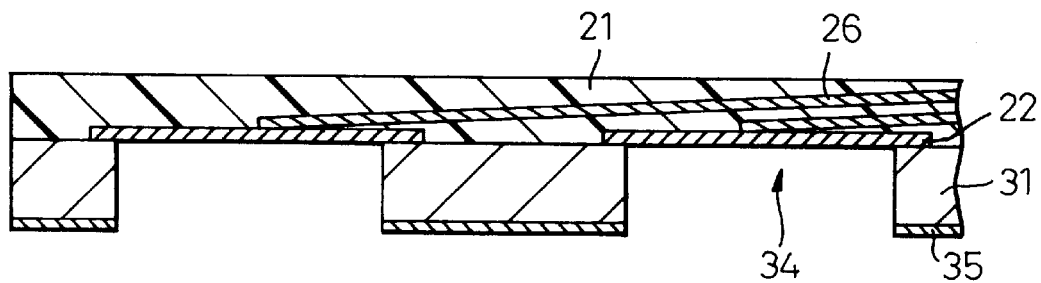
FIGS. 12A to 12D are cross-sectional views showing, in sequence, still another preferred production process of the wiring board according to the present invention.

First, as is shown in FIG. 12A, openings 34 are bored in the predetermined sites of the base body 31 consisting of copper plate. The openings 34 are passed through the base body 31, but a diameter of the openings 34 is smaller than the diameter of the external terminals 22. Generally, the openings 34 can be bored with a high accuracy by etching the base body 31 in the presence of an etching resist 35 covering a bottom surface of the base body 31 except for the opening-providing areas, thereby removing the exposed portions of the base body 31. Prior to this etching process, it is preferred that external terminals 22 are formed in the predetermined sites on one surface of the base body 31 upon electrolytic plating.

Next, the semiconductor terminals (not shown) and the external terminals 22 are electrically connected with the bonding wires 26. Then, the terminal side surface of the base body 31 is fully encapsulated with a polyimide resin 21. As is shown in FIG. 12A, a precursor of the wiring board, i.e., a laminated product of the base body 31 and the polyimide resin 21 having embedded therein the semiconductor terminals (not shown), the external terminals 22 and the bonding wires 26, is obtained.

Figure 12B:
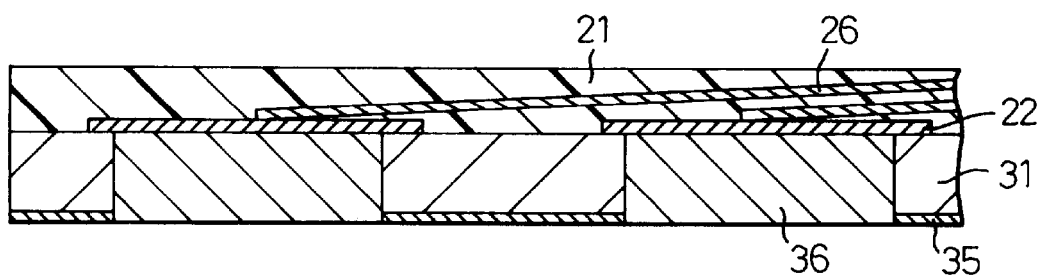

Thereafter, as is shown in FIG. 12B, the openings 34 of the resulting precursor of the wiring board are filled with a solder paste 36, followed by reflowing. The reflowing step is carried out in the presence of the etching resist 35 used as the mask in the previous step. Although not illustrated, as a result of this reflowing step, the solder paste 36 is molten, shrunk and hardened, thereby forming a cylindrical solder 36. Alternatively, the reflowing step may be replaced with other methods such as filling the openings of the precursor of the wiring board with a conductor metal such as low melting point metal with electrolytic plating.

Figure 12C:
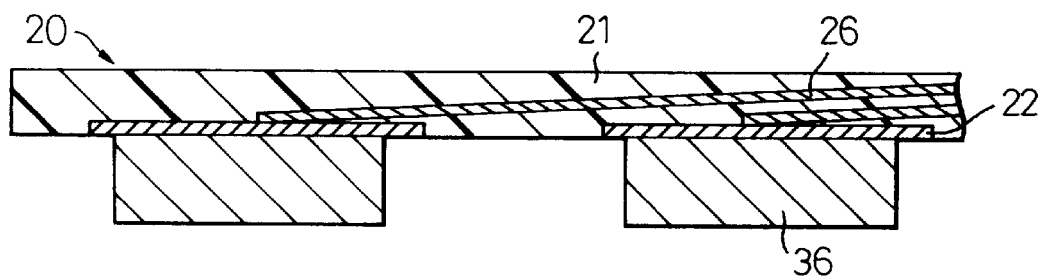

Subsequently, the precursor of the wiring board is subjected to a etching process using a etching solution capable of selectively dissolving the base body 31 and the etching resist 35. After etching, as is shown in FIG. 12C, a wiring board 20 having a cylindrical solder 36 on each external terminal 22 of the substrate 21 is obtained.

Figure 12D:
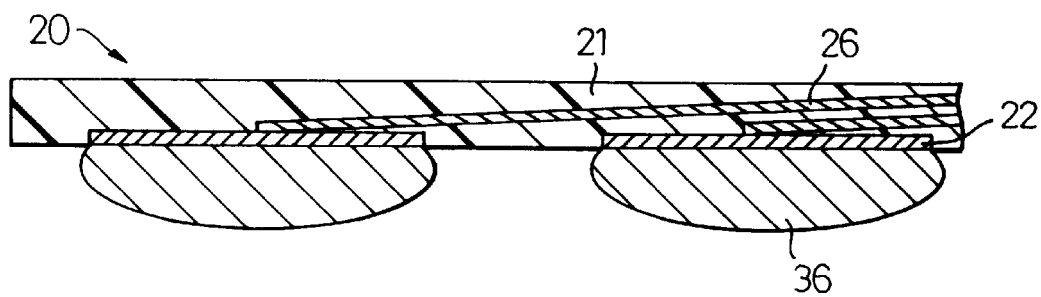

Finally, reflowing is continued. AS is shown in FIG. 12D, the cylindrical solder 36 is molten to form a spherical solder bump on the substrate 31. The thus resulting solder bump can act as a true external terminal in the wiring board of the present invention.

Figure 14:
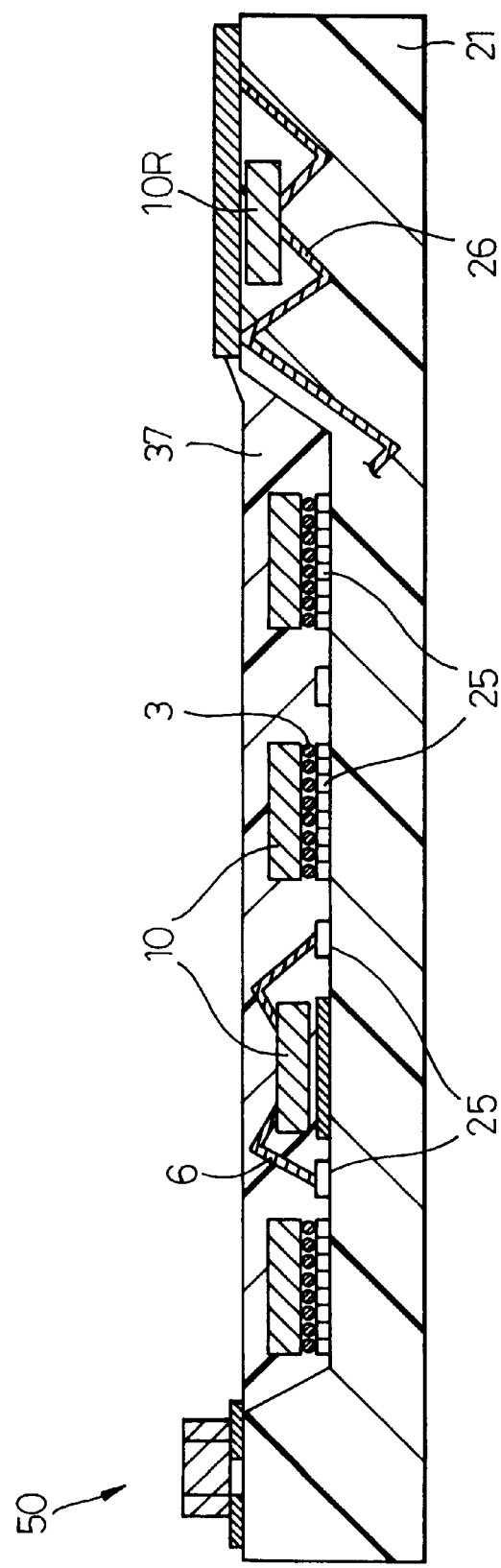
FIG. 14 is a cross-sectional view schematically showing still another preferred example of the semiconductor device of the present invention.

FIGS. 13 and 14 each illustrates other preferred examples of the semiconductor device according to the present invention. Note in these drawings that bonding wires for connecting the semiconductor terminals and the external terminals are omitted from the drawings to simplify the explanation of the same.

The semiconductor device 50 of FIG. 13 contains many sections consisting of the semiconductor terminals 25 on the substrate 21 to satisfy the requirements for the production of a multichip module-type device, and a semiconductor chip 10 is directly packaged on each section of the semiconductor terminals 25 with a flip-chip connection. Further, although not shown, the semiconductor terminals 25 and the external terminals 22 are electrically connected with bonding wires in an interior of the substrate 21. Preferably, the bonding wires used herein have a coaxial structure, as described above.

FIG. 14 illustrates one modification of the semiconductor device 50 of FIG. 13. The illustrated semiconductor device 50 has a large-sized cavity for receiving many semiconductor chips 10 in one surface of the substrate 21. In the cavity of the substrate 21, its bottom surface corresponds to a surface to which the semiconductor terminals 25 are formed. Accordingly, the semiconductor device 50 can be produced by forming a cavity on one surface of the substrate 21, depositing the semiconductor terminals 25 and others on the predetermined sites of the bottom surface of the cavity, and encapsulating the cavity with a suitable insulating resin 37. Although not shown, the semiconductor terminals 25 and the external terminals 22 are electrically connected through bonding wires within the substrate 21. Further, as is illustrated, some semiconductor chips 10 may be connected through a wire 6 to the semiconductor terminal 25 in accordance with the conventional wire bonding method. The wire 6 used herein is thus a conventional conductor wire. That is, according to the illustrated semiconductor device 50, a flip-chip connection can be advantageously used in combination with the conventional wire bonding connection. Note, in the semiconductor device 50, that the semiconductor chip 10R positioned in the right end side of the substrate 21 can be packaged and wire-bonded on the substrate 21 at the timing of forming the semiconductor terminals and the external terminals on a base body (not shown).

Figure 15:
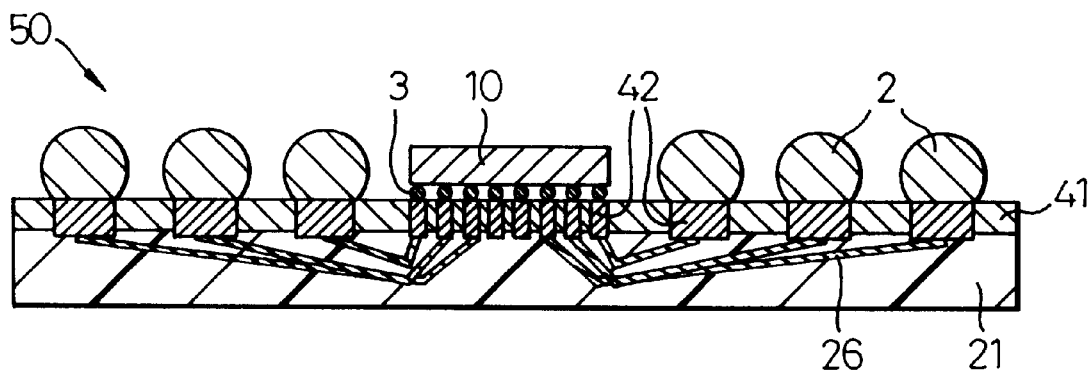
FIG. 15 is a cross-sectional view schematically showing still another preferred example of the semiconductor device of the present invention.

FIG. 15 illustrates still another preferred example of the semiconductor device according to the present invention. In the illustrated semiconductor device 50, the semiconductor terminals and the external terminals on one surface of the substrate 21 of the wiring board each is formed from a cylindrical metal (metal rod) 42. The metal rods 42 are passed through a second insulating substrate 41 laminated in contact with the substrate 21. That is, each metal rod 42 has applied thereon a solder bump 2 capable of acting as an external terminal or a solder bump 3 through which the semiconductor chip 10 is flip-chip connected to the substrate 21. As is shown, the electrical connection between the metal rods 42 can be carried out by the bonding wires (coaxial wires) 26.

In the semiconductor device 50 of FIG. 15, the connection between the metal rod 42 and the solder bump 2 can be carried out by using different methods. Typical examples of the connection method will be described below with reference to FIGS. 16 and 17.

Figure 16:
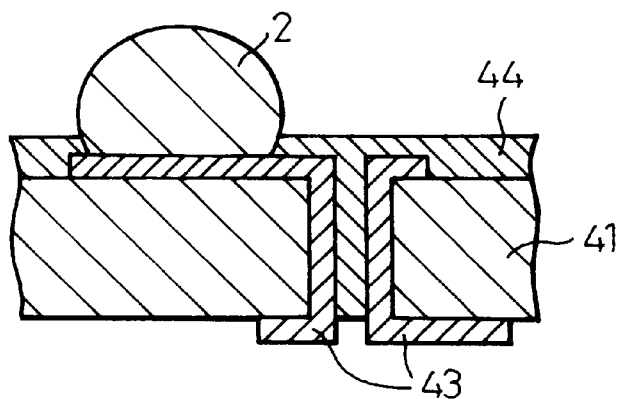
FIG. 16 is an enlarged cross-sectional view schematically showing one modification of the connection section of the semiconductor device of FIG. 15.

According to the method of FIG. 16, after a through-hole was opened in the insulating substrate 41, a conductive metal is deposited onto an inner surface of the through-hole (for example, copper plating can be advantageously used), and the through-hole is fully filled with a solder resist 44.

According to the method of FIG. 17, an insulating resinous substrate 41 is used in place of the insulating substrate of FIG. 16, and a metal rod 42 is inserted in the thickness direction of the substrate 41. The formation of the metal rod 42 can be carried out in accordance with the methods described in the above-cited Japanese Kokai Gazettes.

Figure 18:
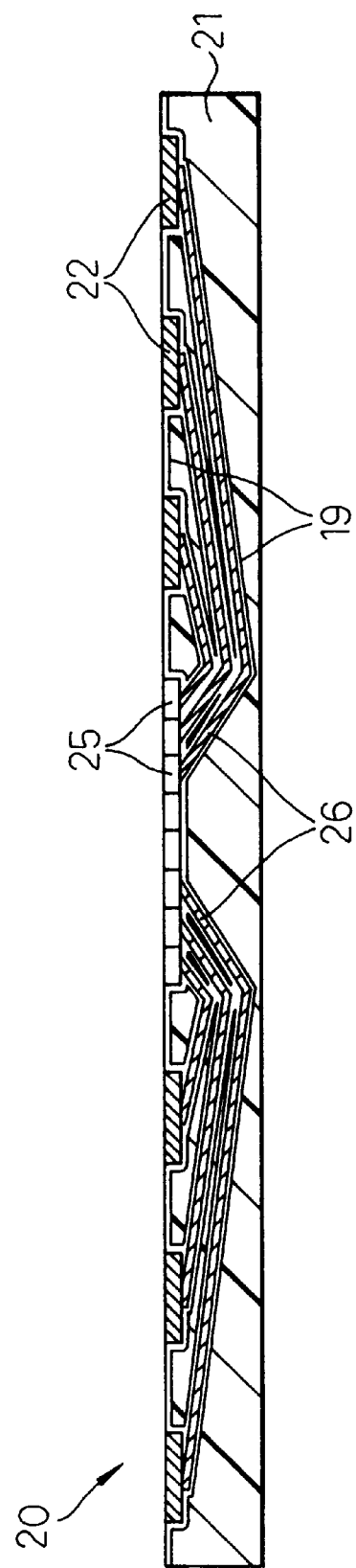
FIG. 18 is a cross-sectional view schematically showing another preferred example of the wiring board according to the present invention.

FIG. 18 illustrates still another preferred example of the wiring board according to the present invention. The illustrated wiring board has a structure similar to that of the wiring board of FIG. 3 explained above, however, as will be explained below, the former wiring board is distinguished from the latter wiring board in the difference that its bonding wire further contains a conductor metal layer as an outermost layer.

The wiring board 20 is constituted from a substrate 21 having formed on one surface thereof the semiconductor terminals 25 and the external terminals 22. If desired, the wiring board 20 may additionally contain other wirings, terminals or components which are conventional in the production of wiring boards. Further, the semiconductor terminals 25 and the external terminals 22 are electrically connected with the bonding wires 26. An outer surface of the bonding wires 26, the connection sections between the bonding wires 26 and the semiconductor terminals 25 or the external terminals 22 and the terminal side surface of the substrate 21 are coated with a thin layer 19 of the conductor metal, i.e., conductor metal layer.

Figure 19:
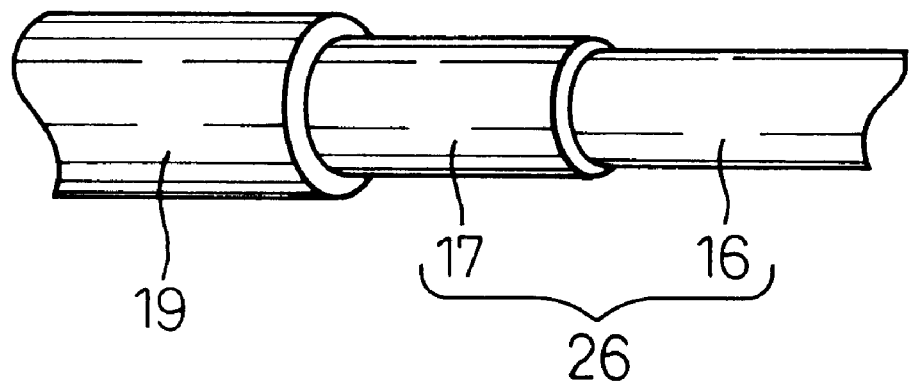
FIG. 19 is a perspective view schematically showing a constitution of the wire used for the electrical connection purpose in the wiring board of FIG. 18.

In the illustrated wiring board 20, the substrate 21 is made of an insulating resinous material. This is because, as is shown in FIG. 19, the bonding wire 26 is constituted from a conductor wire 16 and an insulating coating 17, and a peripheral surface of the insulating coating 17 is further coated with a conductor metal layer 19. As will be easily understood, the bonding wire 26 of FIG. 4 has a single coated coaxial structure, while the bonding wire 26 of FIG. 19 has a duplicated coaxial structure.

In the bonding wire 26 of FIG. 19, the conductor wire 16 as a core body is made of a conductor metal (gold is used herein), the insulating coating 17 surrounding the wire 16 is made of an insulating resin coating (epoxy resin is used herein), and the conductor metal layer 19 as the outermost layer is made of copper plating.

For example, the wiring board 20 of FIG. 18 can be produced in accordance with the production process which will be described below with reference to FIGS. 20A to 20E and FIGS. 21A to 21C.

Figure 20A:
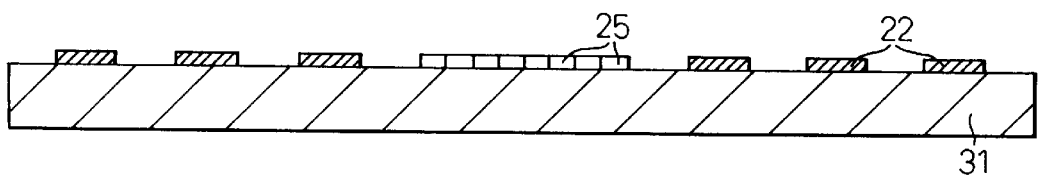
FIGS. 20A to 20E are cross-sectional views showing, in sequence, one preferred production process of the wiring board of FIG. 18.

First, as is shown in FIG. 20A, the semiconductor terminals 25 and the external terminals 22 are formed in the predetermined pattern on one surface of the base body 31 consisting of a copper plate. The terminals 25 and 22 are preferably formed from a gold plating, because gold has a high resistance to the etching solution used in the later base body removal step. Note that additional metal plating may be carried out prior to the gold plating to more improve a bonding strength between the terminals and the semiconductor chip. Suitable metal for the additional metal plating includes, for example, cobalt and palladium.

Figure 20B:
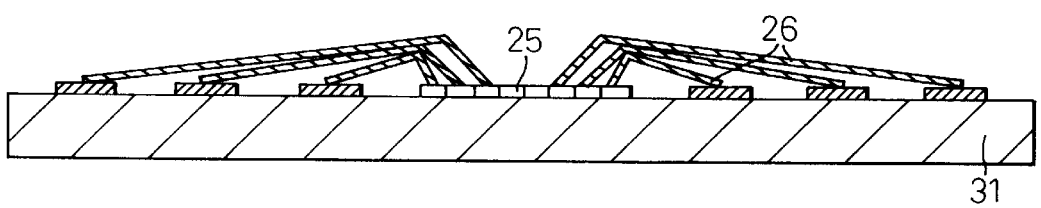
Figure 21A:
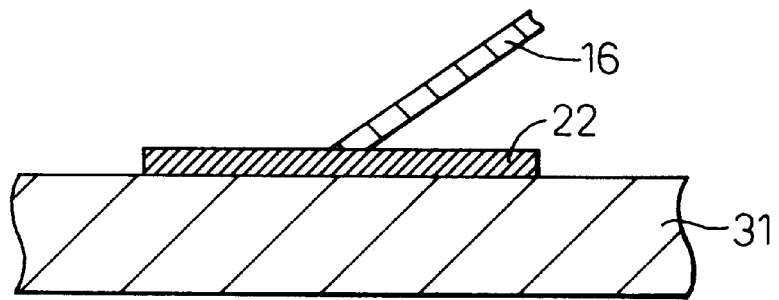
FIGS. 21A to 21C are cross-sectional views showing, in sequence, wire processing steps in the production process of the wiring board illustrated in FIGS. 20A to 20E.
Figure 21B:
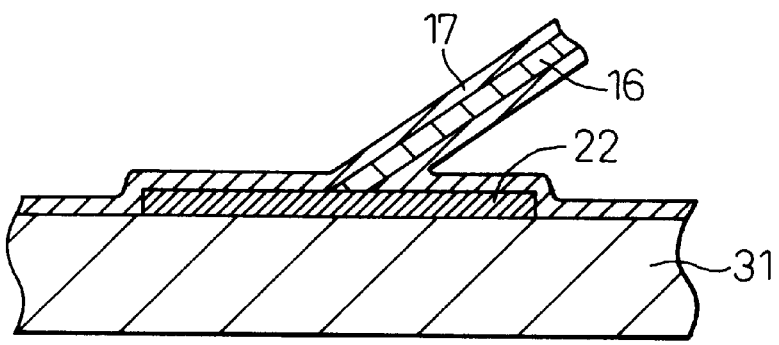

Next, as is shown in FIG. 20B, the semiconductor terminals 25 and the external terminals 22 are electrically connected with the bonding wires 26. The bonding wires 26 used herein may be a coaxial wire explained above with reference to FIG. 4, and thus may use the similar bonding method. That is, as is shown in FIG. 21A, a gold wire 16 is connected through wire bonding to each of the terminals (only one external terminal 22 is shown) on the base body 31, and the wire 16 is spray coated with a powder of the insulating resin (epoxy resin), while the base body 31 is grounded. As is shown in FIG. 21B, the wire 16 is coated with an insulating coating 17 having an uniform thickness to form a bonding wire 26. In addition to the wire 16, a surface of the semiconductor terminals 25 and the externals terminals 22 is also coated with the insulating coating 17.

Figure 20C:
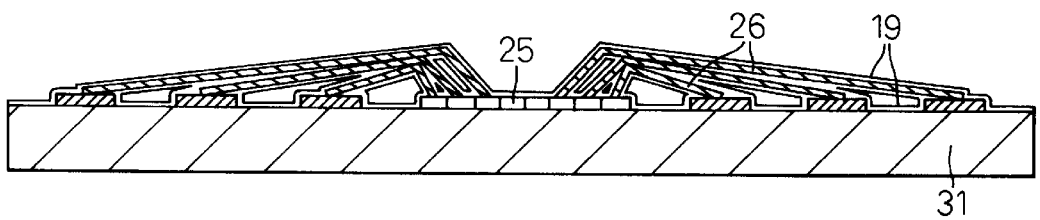
Figure 21C:
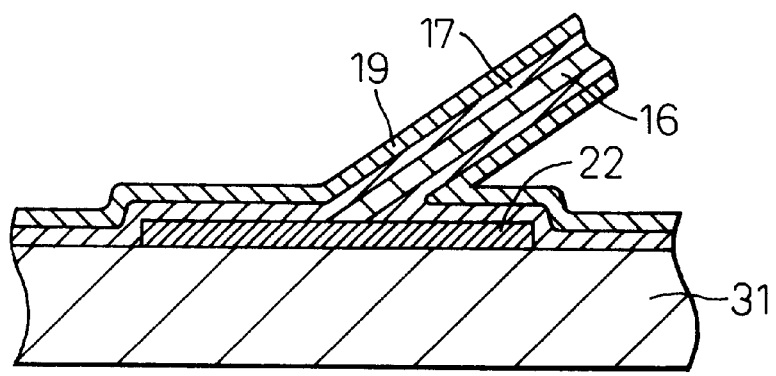

Subsequently, as is shown in FIG. 20C and FIG. 21C, a peripheral surface of the bonding wires 26, the connection sections between the bonding wires 26 and the semiconductor terminals 25 or the external terminals 22 and the terminal side surface of the base body 31 are coated with a conductor metal layer 19. In this step, copper was selected as a conductor metal, and it was subjected to an electrolytic plating process to form the conductor metal layer 19. Of course, an electroless copper plating may be used in place of or in combination with the electrolytic copper plating. These copper plating processes may be carried out in accordance with the conventional methods briefly described above. Preferably, the formation of the conductor metal layer 19 can be carried out by forming a metallic layer or a surface of the insulating coating 17 by electroless plating or the like, followed by conducting the above electrolytic plating, while using the metallic layer as a current supply means.

Figure 20D:
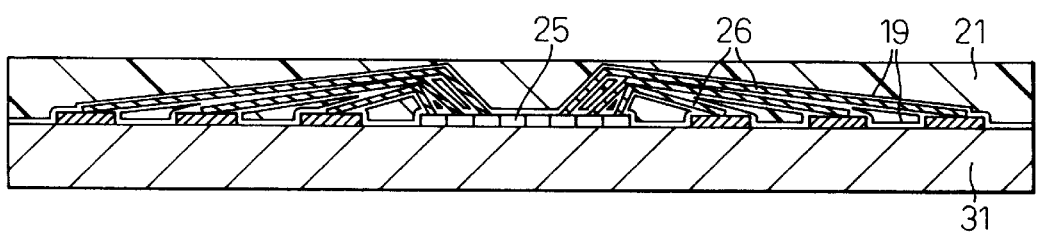
Figure 20E:
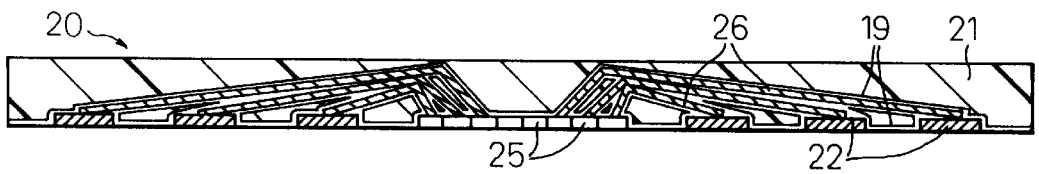

After completion of the bonding between the terminals, as is shown in FIG. 20D, a terminal-bearing surface of the base body 31 is fully encapsulated with a resinous material. In this step, a polyimide resin was used as an encapsulation resin because of its good electrical insulating property, and its solution was applied to the base body surface by potting.

A surface of the base body 31 was covered with the polyimide resin layer 21 at a predetermined thickness, and an original of the wiring board (precursor of the wiring board) containing the semiconductor terminals 25, the external terminals 22 and the wires 26 in the polyimide resin layer 21 was thus obtained.

Thereafter, to obtain a wiring board, the base body 31 was separated from the precursor of the wiring board. The separation of the base body 31 is carried out by immersing the precursor in an etching solution of copper to selectively dissolve and remove only the base body 31. Since the terminals 25 and 22 and the polyimide resin layer 21 are not dissolved in the etching solution, the wiring board 20 shown in FIG. 20E and thus FIG. 18 is obtained.

Figure 22:
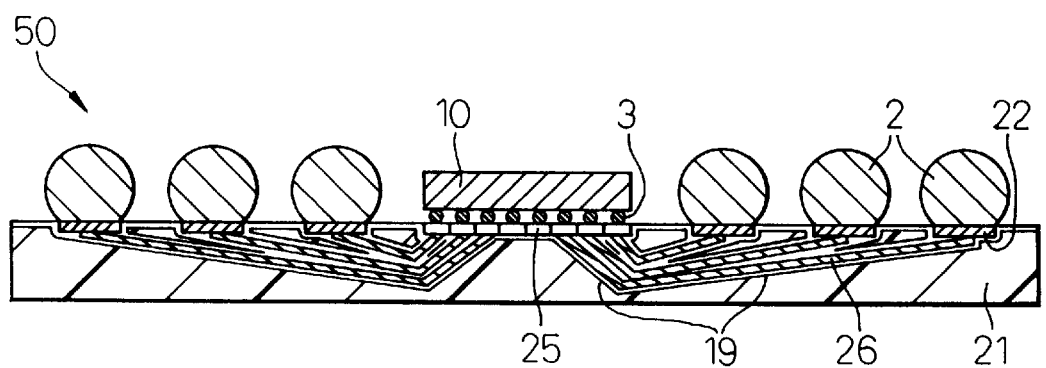
FIG. 22 is a cross-sectional view schematically showing another preferred example of the semiconductor device according to the present invention.

FIG. 22 illustrates still another preferred example of the semiconductor device according to the present invention. The illustrated semiconductor device 50 shows the device produced upon packaging of a semiconductor chip 10 on the wiring board 20 shown in FIG. 18. The semiconductor chip 10 is mounted through bumps 3 on the semiconductor terminals 25 of the wiring board 20. Each of the external terminals 22 have a large-sized bump 2 on a surface thereof. Each bump 2 is made of a solder bump (SnAg).

As will be appreciated, the wiring board, the semiconductor device and their production process described above with reference to FIGS. 18 to 22 may be widely modified within the scope of the present invention, although the modifications are not described herein to avoid duplication. For example, they may be modified or improved as described above with reference to FIGS. 7A to 7C through FIG. 17.

As can be appreciated from the above descriptions concerning the preferred embodiments and working examples of the present invention, according to the present invention, there can be simultaneously obtained the following remarkable functions and effects.

(1) Increase of Connection Reliability in the Wiring Board

In the prior art wiring board having a built-up structure, poor connection reliability was arisen as a problem, because electrical connection between the two connection terminals was made by including a plurality of connection sections such as via connections in the wiring board. Contrary to this, according to the present invention, since the two terminals can be simply connected with only one bonding wire without applying fine wiring patterns to the wiring board, a reliability of the electrical connection can be remarkably improved in the wiring board. Further, even if a distance between the terminals is shortened as a result of dense distribution of the terminals, a reduction of the connection reliability can be effectively prevented.

(2) Increase of Packaging Reliability on the Wiring Board

According to the present invention, bonding wires are embedded into the substrate of the wiring board. In such a wiring board, if the substrate is particularly made from a resinous material having low elasticity, i.e., a low Young's modulus, it becomes possible to moderate a stress generated in the wiring board due to differential thermal expansion coefficient, since the embedded wires can be moved between the terminals for connecting a semiconductor element and the terminals for external connection. Further, since the substrate is generally flexible, it can be easily bent without causing short circuit, open circuit or other defects in the wiring board. Easy bending of the substrate means that the wiring board can be packaged into a semiconductor device without requiring a large packaging space, thereby providing a compact semiconductor device.

(3) Prevention of Crosstalk

According to the present invention, the bonding wires embedded in the substrate have a coaxial structure, since the bonding wires are made of a conductor wire, and a surface of the conductor wire is surrounded with a coating of the insulating resin, and also the substrate embedding the bonding wires is made of an electrically conductive resin along with its connection to the ground potential. Such a coaxial structure of the bonding wires can effectively inhibit or prevent generation of crosstalk between the wiring patterns. In addition, in the bonding wires having a coaxial structure, if a surface of the insulating coating of the wires is further coated with a conductor metal layer and the coated conductor metal layer is connected to a ground potential, the crosstalk can be more effectively prevented since an improved ground connection can be ensured because of presence of the outermost conductor metal layer.

(4) Improved Heat Dissipation

In the wiring board of the present invention, if the substrate, i.e., resinous material, embedding the connecting terminals and the bonding wires is made of a conductor-dispersed conductive resin comprising an electrically conductive resin having dispersed therein particles, powders or other fillers of the electrically conductive material, a heat dissipation property of the semiconductor devices can be improved as a function of the improved thermal conductivity of the wiring board itself.

(5) Easy Impedance Matching in the Wiring Board

When a surface of the bonding wire is coated with an insulating resin in accordance with the present invention, an impedance of the wiring board can be easily controlled and matched by varying a thickness of the insulating resin coating or changing a specific dielectric constant of the insulating resin used, for example.

(6) Improvement in the Production Process

Because of its simple structure, the wiring board and thus the semiconductor device can be produced by using a simplified production process, along with a shortened production time and a reduced production cost. Further, such a simple structure of the wiring board and the semiconductor device means that even if a design of the board or the device was changed, the production process and apparatus can be used without substantial changes. That is, the wiring board and the semiconductor device of the present invention have a large flexibility with regard to changes in their designs or others.

(7) Packaging of a Wide Variety of Semiconductor Elements

According to the present invention, the wiring board is provided as the board product having no packaged semiconductor element. Thus, the producers of semiconductor devices can freely package a wide variety of semiconductor devices depending upon their desires and others. Further, since the wiring board has exposed terminals such as terminals for connecting a semiconductor element and terminals for external connection, packaging operation of the semiconductor elements and others can be easily carried out with a high reliability.

What is claimed is:

1. A wiring board comprising a substrate having applied on the same side surface thereof one or more terminals for connecting a semiconductor element and one or more terminals for external connection, in which said terminals for connecting the semiconductor element and said terminals for external connection are electrically connected, by a wire, with each other, said wire being embedded within said substrate.

2. The wiring board according to claim 1, in which said wire comprises a wire of electrically conducting material coated with a layer of an electrically insulating material.

3. The wiring board according to claim 1, in which said substrate is flexible and is made from a resinous material having a Young's modulus of not more than 1 GPa at a room temperature.

4. The wiring board according to claim 1, in which said substrate is made from an electrically conductive resinous material, and wires connecting between said terminals for connecting the semiconductor element and said terminals for external connection, a surface of said substrate having said terminals, and connecting sections of the wires with said terminals have a coating of an electrically insulating material.

5. The wiring board according to claim 4, in which said electrically conductive resinous material comprises a binder resin having dispersed therein an electrically conductive material.

6. The wiring board according to claim 4, in which said substrate of the electrically conductive resinous material is electrically connected to a ground potential.

7. The wiring board according to claim 4, in which said wire comprises a wire of electrically conducting material coated with a layer of an electrically insulating material having a specific inductive capacity of at least 20.

8. The wiring board according to claim 7, in which an exposed area of said wire having no insulating layer is electrically connected to a ground potential.

9. The wiring board according to claim 1, in which said substrate is made from an electrically insulating resinous material, and wires connecting between said terminals for connecting semiconductor element and said terminals for external connection, a surface of said substrate having said terminals, and connecting sections of the wires with said terminals have a coating of an electrically insulating material and a layer of an electrically conductive metal applied in sequence on a surface thereof.

10. The wiring board according to claim 9, in which said conductive metal layer is a layer produced upon plating of the electrically conductive metal.

11. The wiring board according to claim 9, in which said conductive metal layer is electrically connected to a ground potential.

12. The wiring board according to claim 1, in which said substrate has a cavity for receiving a semiconductor element, a bottom surface of said cavity defining a surface to which said terminals for connecting the semiconductor element are applied.

13. The wiring board according to claim 1, in which said terminals for connecting the semiconductor element are provided in two or more sites of the same side surface of said substrate, and said terminals in adjacent sites of said substrate are electrically connected, by a wire, with each other in an interior of said substrate.

14. A process for the production of a wiring board comprising a substrate having applied on the same side surface thereof one or more terminals for connecting a semiconductor element and one or more terminals for external connection, in which said terminals for connecting the semiconductor element and said terminals for external connection are electrically connected, by a wire, with each other, which process comprises the steps of:

forming terminals for connecting the semiconductor element and said terminals for external connection in predetermined sites on the same side surface of a base body;

electrically connecting said terminals for connecting the semiconductor element and said terminals for external connection through wires;

applying a resinous material to said surface of said base body at a predetermined thickness to form a wiring board precursor comprising said base body having resin-encapsulated thereon said terminals for connecting the semiconductor element, said terminals for external connection and said wires; and separating the wiring board having said substrate with the embedded wires from the base body of said wiring board precursor.

15. The production process according to claim 14, in which said wiring board is separated from said base body through etching off of said base body.

16. The production process according to claim 14, in which said terminals for connecting the semiconductor element and said terminals for external connection each is produced in the form of a composite pad of a first pad and a second pad, wherein said first pad is formed upon plating of a low melting point metal, followed by forming said second pad upon plating of a metal having a melting point higher than that of said low melting point metal.

17. The production process according to claim 16, in which said first pad is formed in a wider area than the area of said second pad.

18. The production process according to claim 14, in which a wire of electrically conducting material coated with a layer of an electrically insulating material is used as said wire.

19. The production process according to claim 14, in which, after the electrical connection step, said wires connecting said terminals for connecting the semiconductor element with said terminals for external connection, said surface of the base body having said terminals, and said connecting sections of the wires with said terminals are coated with an electrically insulating material, and the coated base body is encapsulated with an electrically conductive resinous material.

20. The production process according to claim 14, in which, after the electrical connection step, said wires connecting said terminals for connecting the semiconductor element with said terminals for external connection, said surface of the base body having said terminals, and said connecting sections of the wires with said terminals are coated with an electrically insulating material to form an insulating coating, the insulating coating is coated with an electrically conductive metal to form a conductive metal layer, and the coated base body is encapsulated with an electrically insulating resinous material.

21. The production process according to claim 14, in which, after preparation of said wiring board precursor having resin-encapsulated thereon said terminals for connecting semiconductor element, said terminals for external connection and said wires, openings are formed on predetermined sites of said base body in such a manner that the resulting openings are passed through said base body and have a diameter smaller than the area of said terminals, a low melting point metal is filled in said openings to form connection bumps on said terminals, and said wiring board precursor is separated from said base body.

22. A process for the production of a wiring board comprising a substrate having applied on the same side surface thereof one or more terminals for connecting a semiconductor element and one or more terminals for external connection, in which said terminals for connecting the semiconductor element and said terminals for external connection are electrically connected, by a wire, with each other, said wire being embedded within said substrate, which process comprises the steps of:

providing, on predetermined sites of a base body, rods made of an electrically conductive metal and passed through said base body to form said terminals for connecting the semiconductor element and said terminals for external connection, said terminals being defined by one end surface of said rods which is exposing at one surface of said base body;

electrically connecting said terminals for connecting the semiconductor element and said terminals for external connection through wires; and applying a resinous material to said one surface of said base body at a predetermined thickness to form a wiring board with the substrate having resin-encapsulated therein said terminals for connecting the semiconductor element, said terminals for external connection and said wires.

23. The production process according to claim 22, in which a wire of electrically conducting material coated with a layer of an electrically insulating material is used as said wire.

24. The production process according to claim 22, in which, after the electrical connection step, said wires connecting said terminals for connecting the semiconductor element with said terminals for external connection, said surface of the base body having said terminals, and said connecting sections of the wires with said terminals are coated with an electrically insulating material, and the coated base body is encapsulated with an electrically conductive resinous material.

25. The production process according to claim 22, in which, after the electrical connection step, said wires connecting said terminals for connecting the semiconductor element with said terminals for external connection, said surface of the base body having said terminals, and said connecting sections of the wires with said terminals are coated with an electrically insulating material to form an insulating coating, the insulating coating is coated with an electrically conductive metal to form a conductive metal layer, and the coated base body is encapsulated with an electrically insulating resinous material.

26. A semiconductor device comprising a wiring board and one or more semiconductor elements packaged on predetermined sites of said wiring board, in which said wiring board comprises a substrate having applied on the same side surface thereof one or more terminals for connecting a semiconductor element and one or more terminals for external connection, said terminals for connecting the semiconductor element and said terminals for external connection being electrically connected, by a wire, with each other, said wire being embedded within said substrate.

27. The semiconductor device according to claim 26, in which a wire of electrically conducting material coated with a layer of an electrically insulating material is used as said wire.

28. The semiconductor device according to claim 26, in which said substrate is made from an electrically conductive resinous material, and wires connecting said terminals for connecting the semiconductor element with said terminals for external connection, a surface of said substrate having said terminals, and connecting sections of the wires with said terminals have a coating of an electrically insulating material.

29. The semiconductor device according to claim 26, in which said substrate is made from an electrically insulating resinous material, and wires connecting said terminals for the semiconductor element with said terminals for external connection, a surface of said substrate having said terminals, and connecting sections of the wires with said terminals have a coating of an electrically insulating material and a layer of an electrically conductive metal applied in sequence on a surface thereof.

30. A process for the production of a semiconductor device comprising a wiring board and one or more semiconductor elements packaged on predetermined sites of said wiring board, which process comprises the steps of:

forming terminals for connecting the semiconductor element and terminals for external connection in predetermined sites on the same side surface of a base body;

electrically connecting said terminals for connecting the semiconductor element and said terminals for external connection through wires;

applying a resinous material to said surface of the base body at a predetermined thickness to form a wiring board precursor comprising said base body having resin-encapsulated thereon said terminals for connecting the semiconductor element, said terminals for external connection and said wires;

separating the wiring board having said substrate with the embedded wires from the base body of said wiring board precursor; and packaging and electrically connecting said semiconductor elements onto said terminals for connecting the semiconductor element of said wiring board.

\* \* \* \* \*